US007928003B2

(12) United States Patent
Naik

(10) Patent No.: US 7,928,003 B2
(45) Date of Patent: Apr. 19, 2011

(54) AIR GAP INTERCONNECTS USING CARBON-BASED FILMS

(75) Inventor: Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 260 days.

(21) Appl. No.: 12/249,172

(22) Filed: Oct. 10, 2008

(65) Prior Publication Data

US 2010/0093168 A1    Apr. 15, 2010

(51) Int. Cl.
*H01L 21/00* (2006.01)
(52) U.S. Cl. .................... 438/626; 438/631; 438/624
(58) Field of Classification Search .................. 438/624, 438/626, 631
See application file for complete search history.

(56) References Cited

U.S. PATENT DOCUMENTS

| 5,461,003 | A | * | 10/1995 | Havemann et al. | ........... 438/666 |
| 5,641,712 | A | * | 6/1997 | Grivna et al. | ................. 438/624 |
| 7,670,924 | B2 | * | 3/2010 | Demos et al. | ................. 438/421 |

* cited by examiner

*Primary Examiner* — Richard A. Booth
(74) *Attorney, Agent, or Firm* — Blakely Sokoloff Taylor & Zafman

(57) ABSTRACT

A method of forming an interconnect structure comprising: forming a sacrificial inter-metal dielectric (IMD) layer over a substrate, wherein the sacrificial IMD layer comprising a carbon-based film, such as amorphous carbon, advanced patterning films, porous carbon, or any combination thereof; forming a plurality of metal interconnect lines within the sacrificial IMD layer; removing the sacrificial IMD layer, with an oxygen based reactive process; and depositing a nonconformal dielectric layer to form air gaps between the plurality of metal interconnect lines. The metal interconnect lines may comprise copper, aluminum, tantalum, tungsten, titanium, tantalum nitride, titanium nitride, tungsten nitride, or any combination thereof. Carbon-based films and patterned photoresist layers may be simultaneously removed with the same reactive process. Highly reactive hydrogen radicals processes may be used to remove the carbon-based film and simultaneously pre-clean the metal interconnect lines prior to the deposition of a conformal metal barrier liner.

28 Claims, 31 Drawing Sheets

AIR GAP INTERCONNECTS USING CARBON-BASED FILMS

BACKGROUND OF THE INVENTION

1. Field of the Invention

The present invention relates to electrical interconnect structures for interconnecting a plurality of devices, such as semiconductor devices. In particular, to methods of making interconnect structures having air gaps in the dielectric material between the interconnect lines of the interconnect structure.

2. Discussion of Related Art

The semiconductor industry is continually pursuing smaller and smaller geometries of the structures used in semiconductor devices. As the device geometries become smaller, more devices are fabricated into the same area of semiconductor substrate. Therefore, the number of interconnect lines in the same area of substrate must also increase, thus requiring that the spacing between the interconnect lines to also decrease in size. This results in increased intra-line capacitance and cross-talk between the closely spaced interconnect lines.

In order to reduce intra-line capacitance and cross-talk between interconnect lines, it is desirable to use a material between the interconnect lines that has a low dielectric constant (low-k). Since air has a low dielectric constant, it is desirable to have air gaps in the dielectric material between the interconnect lines to lower the capacitance between the interconnect lines. One of the issues related to making air gap interconnects is the removal of a sacrificial inter-metal-dielectric (IMD), which is later substituted by a non-conformal chemical vapor deposition (CVD) dielectric to form the air gaps. The removal of the sacrificial IMD can be difficult, having problems with the removal of residues, which can have a detrimental effect on the intra-line capacitance of the interconnect structure. Use of harsher removal methods may lead to damage to the interconnect metals, such as copper. Often additional, and/or longer, more complex processing steps may be employed to remove any remaining polymer and/or post-etch residues remaining after the removal of the sacrificial IMD. Such post-etch treatments may be performed for up to 5 minutes, in addition to time for loading and unloading the substrate, wafer processing start-up and shut-down times for each wafer, and increased down time due to increased usage of the equipment, thus reducing wafer throughput for the method of making an interconnect structure, particularly when making air gaps for the interconnect structure.

SUMMARY OF THE INVENTION

Embodiments provide a method of forming an interconnect structure that may comprise: forming a sacrificial inter-metal dielectric (IMD) layer over a substrate, wherein the sacrificial IMD layer comprising a carbon-based film, such as amorphous carbon, advanced patterning films, porous carbon, or any combination thereof; forming a plurality of metal interconnect lines within the sacrificial IMD layer; removing the sacrificial IMD layer, wherein the removal of all or part of the carbon-based film comprises a reactive process having oxygen based chemistries; and depositing a non-conformal dielectric layer to form air gaps between the plurality of metal interconnect lines. Embodiments may further comprise depositing and patterning a photoresist layer used in the forming of the said interconnect structure, and wherein the reactive process for removing all or part of the carbon-based film is also used for the simultaneous removal of the patterned photoresist layer. Embodiments may further comprise depositing a conformal metal barrier liner on the plurality of interconnect lines prior to the deposition of the non-conformal dielectric layer, and wherein a highly reactive hydrogen radicals process may be used to remove all or part of the carbon-based film and to pre-clean the surface of the metal interconnect lines prior to the deposition of the conformal metal barrier liner, wherein the removal and pre-clean processes are combined into a single process on a single piece of equipment.

In embodiments, the metal interconnect lines may comprise a metal and/or conductive compound selected from the group consisting of: copper, aluminum, tantalum, tungsten, titanium, tantalum nitride, titanium nitride, tungsten nitride, and any combination thereof.

Embodiments provide a method of forming an interconnect structure that may comprise: providing a substrate on which to form the interconnect structure; blanket depositing a carbon-based film over the substrate; blanket depositing a non-carbon-based film over the carbon-based film; blanket depositing a layer of photoresist over the non-carbon-based film; patterning the photoresist layer; transferring the patterned photoresist layer onto the non-carbon-based film; transferring the patterned non-carbon-based film to the carbon-based film; removing the patterned photoresist layer, where in some embodiments the removing of the patterned photoresist layer may occur during the transferring of the patterned non-carbon-based film to the carbon-based film; blanket depositing a metal conductor layer; planarizing the metal conductor layer; removing the patterned carbon-based film; and blanket depositing a non-conformal dielectric layer, wherein the non-conformal dielectric layer forms air gaps in regions between the planarized metal conductors.

Embodiments provide a method of forming an interconnect structure that may comprise: providing a substrate having an air gap area and an exclusion area; blanket depositing a first carbon-based film over the substrate; blanket depositing a non-carbon-based film over the first carbon-based film; blanket depositing and patterning an interconnect photoresist layer with an interconnect pattern; transferring the interconnect pattern to the non-carbon-based film; transferring the interconnect pattern to the first carbon-based film; removing the patterned interconnect photoresist layer, where in some embodiments the removing of the first patterned photoresist layer may occur during the transferring of the patterned non-carbon-based film to the carbon-based film; blanket depositing and planarizing a metal layer to form a plurality of planarized metal interconnect lines; blanket depositing a first barrier layer; blanket depositing and patterning an exclusion photoresist layer to protect the exclusion area; removing the first barrier layer from the air gap area; removing the exclusion patterned exclusion photoresist layer from the exclusion area and removing the first patterned carbon-based film from the air gap area; and blanket depositing a non-conformal dielectric layer to form air gaps in the air gap area, wherein the air gaps are positioned between the planarized metal interconnect lines.

Embodiments may further comprise: planarizing the non-conformal dielectric layer, wherein in the air gap area the air gaps are engulfed in the planarized non-conformal dielectric, and wherein planarizing the non-conformal dielectric layer in the exclusion area removes at least part of the non-conformal dielectric from the exclusion area; and wherein the first carbon-based film comprises a organic low-k dielectric material. Embodiments further comprise wherein the organic low-k dielectric material has good electrical isolation properties and is suitable for permanently isolating the planarized metal interconnect lines for the life of the interconnect structure.

Embodiments may further comprise: planarizing the substrate after the deposition of the non-conformal dielectric layer, until exposing the first patterned carbon-based film in the exclusion area, and while also preserving the structural integrity of the air gaps in the planarized non-conformal dielectric in the air gap area; removing the first patterned carbon-based film in the exclusion area; and blanket depositing and planarizing a filler dielectric so that the planarized filler dielectric occupies the region between the planarized metal interconnects in the exclusion area. Embodiments may further comprise blanket depositing a second metal barrier liner before the deposition of the filler dielectric. Embodiments may further comprise wherein the removal of the patterned first carbon-based film in the exclusion area may comprise a highly reactive hydrogen radicals process to remove the patterned carbon-based film and to pre-clean the surface of the planarized metal interconnects prior to the deposition of the second metal barrier liner, thus combining the removal and pre-clean processes into a single process.

Embodiments provide a method of forming an interconnect structure that may comprise: providing a substrate having a first level metal interconnect structure; blanket depositing a second level ILD layer, a second level carbon-based film, a second level etch stop layer, and a second level hard mask layer; blanket depositing and patterning a second level trench patterned photoresist layer; transferring the second level trench pattern to the second level hard mask layer; removing the second level trench patterned photoresist layer; blanket depositing and patterning a second level via photoresist layer; transferring the second level via pattern to the second level etch stop layer; transferring the second level via pattern to the second level carbon-based film and removing the second level via patterned photoresist layer; transferring the second level via pattern to the second level ILD layer; transferring the second level via pattern to the surface the first level metal interconnect structure; transferring the second level trench pattern to the second level via patterned etch stop to form a second level trench patterned etch stop; transferring the second level trench pattern to the second level via patterned carbon-based layer to form a second level trench patterned carbon-based layer; removing the second level trench patterned hard mask; blanket depositing and planarizing a conductive metal to form a plurality of second level metal interconnect lines and a plurality of metal vias in contact with the first level metal interconnect structure; removing the second level trench patterned etch stop layer to expose the second level trench patterned carbon-based film; removing the second level trench patterned carbon-based film; and blanket depositing and planarizing a second level non-conformal dielectric layer to forming a second level air gap in the planarized non-conformal dielectric layer in the regions between the second level metal interconnect lines. Embodiments may further comprise providing a second level cap layer over the second level hard mask layer.

Embodiments provide a method of forming an interconnect structure that may comprise providing a substrate having a first level metal interconnect structure and a first level barrier layer cap; blanket depositing a second level ILD layer, a second level carbon-based film, a second level etch stop film, and a second level hard mask layer; blanket depositing and patterning a second level via patterned photoresist layer; transferring the second level via pattern to the second level hard mask layer and the second level etch stop film; transferring the second level via pattern to the second level carbon-based film and removing the second level via patterned photoresist layer; transferring the second level via pattern to the second level ILD layer; blanket depositing and patterning a second level trench patterned photoreist layer; transferring the second level trench pattern to the second level hard mask layer and the second level etch stop film; transferring the second level trench pattern to the second level via patterned carbon-based film and removing the second level trench patterned photoresist layer; transferring the via pattern from the second level via patterned ILD layer to the first level barrier layer cap; blanket depositing and planarizing a plurality of second level metal interconnect lines with a plurality of metal vias in contact with the first level metal interconnect structure; removing any remaining portion of the second level trench patterned hard mask layer and the second level trench patterned etch stop film; removing the second level trench patterned carbon-based film; and blanket depositing and planarizing a second level non-conformal dielectric layer, whereby forming second level air gaps in the dielectric regions between the second level metal interconnect lines. Embodiments may further comprise providing a second level cap layer over the second level hard mask layer.

Embodiments provide a method of forming an interconnect structure that may comprise: providing a substrate having a first level metal interconnect structure and a second level ILD layer; blanket depositing and patterning a second level via patterned photoresist layer; transferring the second level via pattern to the second level ILD layer and to the surface of the first level metal interconnect structure; removing the second level via patterned photoresist layer; performing a blanket metallization deposition and planarization to form a plurality of metal vias in electrical contact with the first metal interconnect structure; selectively depositing a selective via metal cap over the metal vias; blanket depositing a second level carbon-based film and a second level hard mask layer; blanket depositing and patterning a second level trench patterned photoresist layer; transferring the second level trench pattern to the second level second hard mask layer; transferring the trench pattern onto the second level carbon-based film to form a second level trench patterned carbon-based film; removing the second level trench patterned photoresist layer; removing the second level trench patterned hard mask layer; blanket depositing and planarizing a metal layer to form a plurality of second level metal interconnect lines in electrical contact with the metal vias; removing the second level trench patterned carbon-based film; and blanket depositing and planarizing a second level non-conformal dielectric layer forming second level air gaps in the dielectric regions between the second level metal interconnect lines.

BRIEF DESCRIPTION OF THE DRAWINGS

Embodiments of the invention are described by way of example with reference to the accompanying drawings. It is to be noted, that the appended drawings illustrate only exemplary embodiments, and are not to be considered limiting the scope of the embodiments or invention, for the invention may admit to other equally effective embodiments. Further embodiments may be devised by combining features of various embodiments presented, without departing from the scope thereof. Applicant reserves all rights with respect to the applicability of the doctrine of equivalents.

DETAILED DESCRIPTION OF THE PRESENT INVENTION

Figure 1:
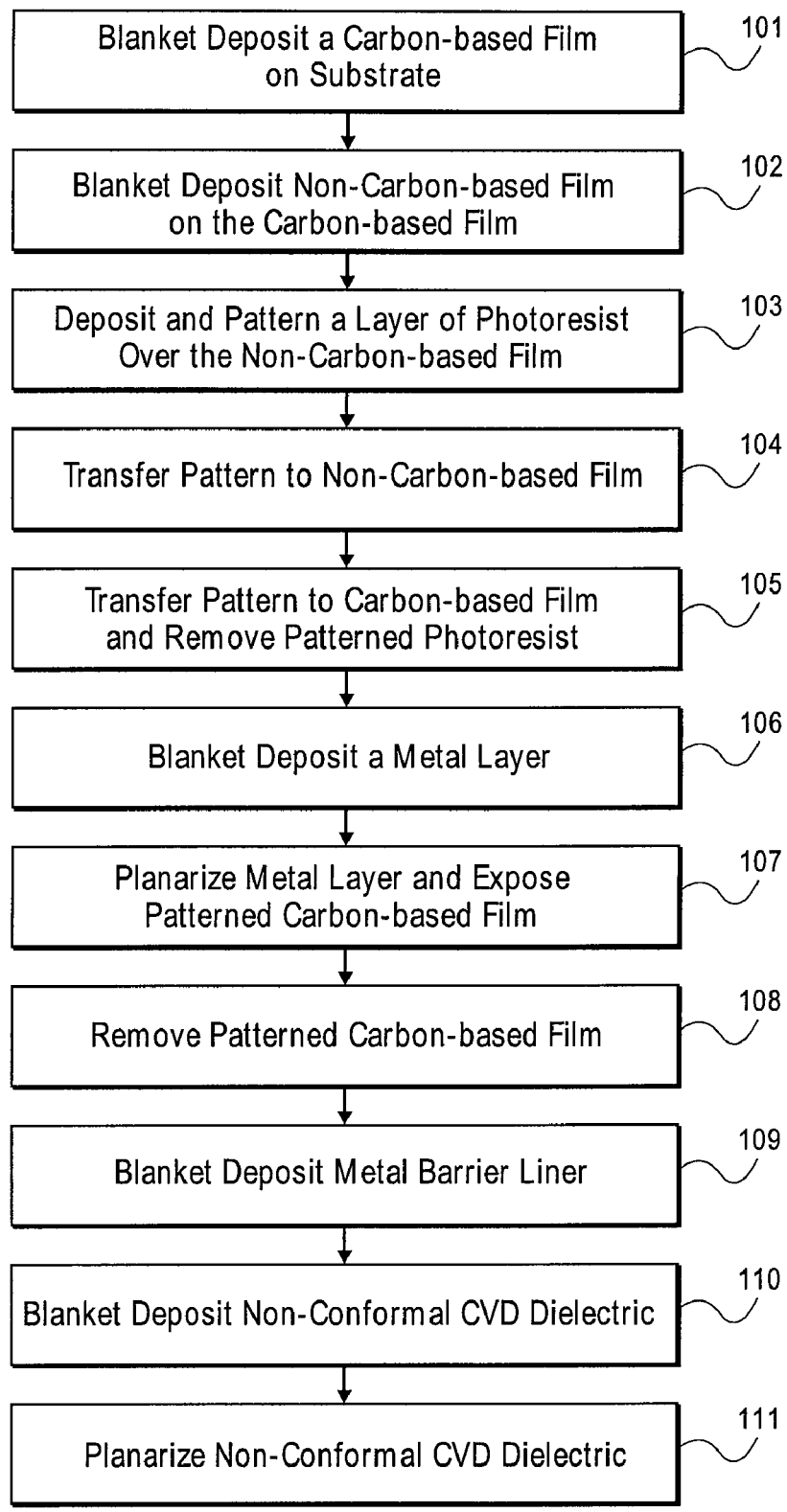
FIG. 1 illustrates a flowchart of embodiments of a method of making an interconnect structure, which may be a single level interconnect having air gaps between the interconnect lines.

In the following description, various aspects of the present invention will be described, and various details set forth in order to provide a thorough understanding of the present invention. However, it would be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1A through 14F are merely illustrative and may not be drawn to scale. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Reference in this specification to "one embodiment" or "an embodiment" means that a particular feature, structure, process or method step, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some embodiments anticipate the application of the invention in any process or method of making a structure having air gaps wherein a carbon-based film may provide a sacrificial material that may be easy to remove, may not damage the components of the structure being made, and may not leave a residue. Such air gap structures may include but are not limited to microelectronic interconnect structures and microelectromechanical (MEM) devices. However, most embodiments discussed will generally relate to semiconductor air gap interconnect structures and methods of making said interconnect structures, but are not intended to limit the embodiments to only those interconnect structures and methods of making described. In embodiments, carbon-based films are used as sacrificial inter-metal dielectric (IMD) layers, which are later substituted by non-conformal dielectric layers to form air gaps, particularly in the regions between the interconnect lines, thus lowering the intra-line capacitance and cross-talk between interconnect lines. In embodiments, the carbon-based film may easily be removed by oxygen-based chemistries, which may involve simpler, cheaper, and less hazardous processes and equipment. In some embodiments, the oxygen-based chemistries may include gases selected from the group consisting of: $O_2$, $SO_2$, $CO_2$, $CO$, and any combination thereof. In some embodiments, the removal of the carbon-based film by oxygen based chemistries may also include the simultaneous removal of photoresist layers, thus simplifying and reducing the total number of steps in the manufacturing process and thus reducing the associated costs. In some embodiments, other chemistries and processes may also be used to remove the carbon-based film.

In embodiments, the carbon-based film may comprise a carbon-based material selected from the group consisting of: amorphous carbon, advanced patterning films (APF™) (available from Applied Materials, Inc. of Santa Clara, Calif.), porous carbon, spin-on organic low-k dielectric materials, organic low-k dielectrics, and any combination thereof. In embodiments, the APF™ films may comprise an amorphous carbon layer that may comprise carbon and hydrogen. In embodiments, the amorphous carbon layer may further comprise a dopant selected from the group consisting of: nitrogen, boron, fluorine, phosphorous, and any combination thereof. In embodiments, the organic low-k dielectric may have a dielectric constant of less than 3.0. In embodiments, the method of forming the amorphous carbon layer may comprise a process selected from the group consisting of: chemical vapor deposition (CVD), high density plasma CVD, and any combination thereof. Embodiments may include forming the amorphous carbon layer from a gas mixture comprising a hydrocarbon compound and an inert gas. Embodiments may include wherein the hydrocarbon compound comprises a hydrocarbon selected from the group consisting of: propylene, propyne, propane, butane, butylenes, butadiene, acetylene, and any combination thereof.

Embodiments may include wherein the inert gas may comprise an inert gas selected from the group consisting of: argon, helium, xenon, krypton, neon, and any combination thereof. Embodiments may comprise hydrogen-based gases added to the gas mixture, such as, hydrogen and/or ammonia, to control the hydrogen content of the amorphous carbon layer. In embodiments, the amorphous carbon layer may comprise about 10% hydrogen to about 60% hydrogen. In an embodiment, the hydrogen content of the amorphous carbon layer may be adjusted to control the optical properties of the amorphous carbon layer, which may assist in the lithography of patterning the photoresist layer. In an embodiment, the hydrogen content of the amorphous carbon layer may be adjusted to control the etch selectivity of the amorphous carbon layer. It may be advantageous to adjust the etch selectivity for the amorphous carbon layer so that the amorphous carbon layer is easily and completely removed. Embodiments providing a sacrificial IMD layer, which may be easily and completely removed, may result in eliminating a post-etch treatment to remove any remaining polymer and/or post-etch residues after the removal of the sacrificial IMD layer. The elimination of a post-etch treatment may likely result in reduced processing costs and increased wafer throughput. In an embodiment, the etch resistance of the amorphous carbon layer may decreased as the hydrogen content is increased, depending on the etch chemistry. Embodiments may comprise supplemental gases added to the mixture, such as, argon, helium, nitrogen, or any combination thereof, to control the density and deposition rate of the amorphous carbon layer.

Embodiments, illustrated in FIG. 1, relate to a flowchart of a method of making an interconnect structure having a plurality of interconnect lines having air gaps between the interconnect lines. Embodiments may comprise forming a single level of interconnect lines or structures on a substrate, wherein the substrate may comprise semiconductor devices, with or without another interconnect structure. Embodiments of the method comprise blanket depositing a carbon-based film on a substrate, block 101, blanket depositing a non-carbon-based film on the carbon-based film, block 102, depositing and patterning a layer of photoresist over the non-carbon-based film, block 103, transferring the pattern to the non-carbon-based film, block 104, transferring the pattern to carbon-based film and removing the patterned photoresist layer, block 105, blanket depositing a metal layer, block 106, planarizing the metal layer and exposing the patterned carbon-based film, block 107, removing the patterned carbon-based film, block 108, blanket depositing a metal barrier liner, block 109, blanket depositing a non-conformal dielectric layer, block 110, and planarize the non-conformal dielectric layer, block 111.

Embodiments may further comprise methods of double patterning photoresist, such as when depositing and patterning a layer of photoresist over the non-carbon-based film. Methods of double patterning may have advantages of achieving higher densities of interconnects by reducing the pitch between adjacent interconnects. Embodiments of the double patterning methods comprise using two or more masks having relaxed pitches between alternating interconnect structures. However, the interconnect structures on each mask are different and offset in position from the interconnect structures on the other masks. Consequently, tighter pitches may be achieved by aligning the offsetting masks so that the interconnect lines formed from a second mask are positioned in the regions between the interconnect lines formed from a first mask. Tighter pitches may result in higher densities of interconnects, which may require superior isolation properties of the dielectric structures positioned between adjacent interconnects. Embodiments comprising a sacrificial carbon-based material that may provide the added advantage of complete or nearly complete removal of the carbon-based material with little or no residues with a relatively simple and non-invasive oxidizing process. The advantages of the superior, simple, and clean removal of the sacrificial carbon-based layer, may be especially useful for high density interconnect structures wherein the isolation regions between the interconnect structures are smaller, and thus, much more difficult to completely remove all of the sacrificial materials in the isolation regions.

Figure 13A:
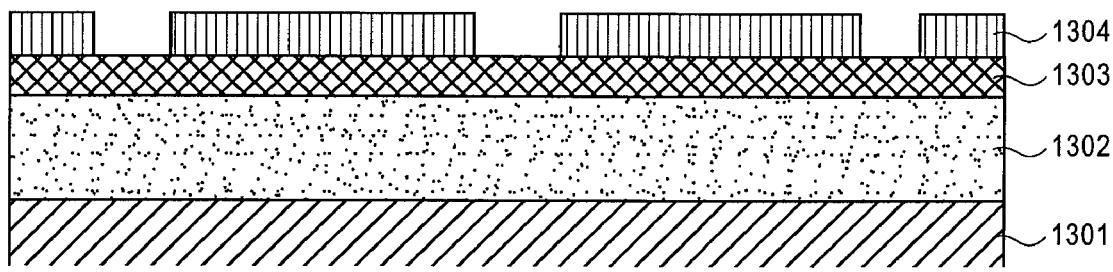
FIGS. 13A to 13C illustrate cross sectional views of embodiments of methods of patterning photoresist used for making an interconnect structure. Embodiments of patterning photoresist comprising first and second expose/develop double patterning methods are illustrated.
Figure 13B:
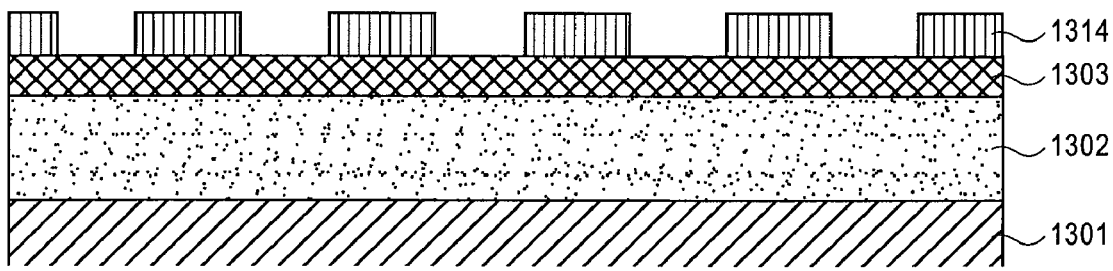
Figure 13C:
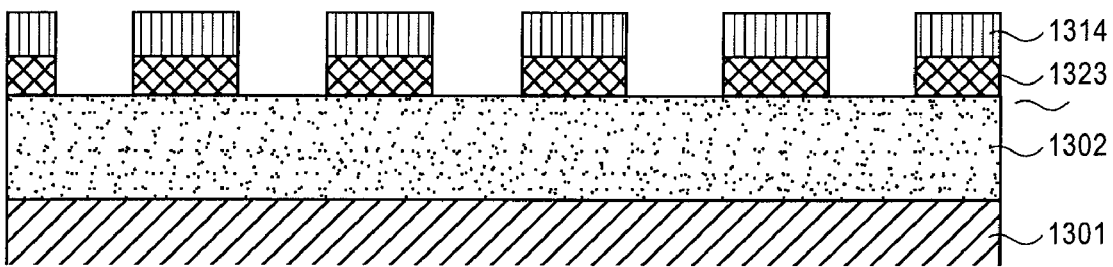

Embodiments of methods of double patterning photoresist may comprise a first expose/develop and then a second expose/develop method. Embodiments of methods of double patterning may further comprise a resist freeze method, wherein the photoresist, after patterning by the first mask may be made more stable. Embodiments of the first and second expose/develop method may be illustrated in FIGS. 13A to 13C. Embodiments, illustrated in FIG. 13A, comprise providing a substrate 1301, a carbon-based film 1302, and a non-carbon-based film 1303; and blanket depositing and patterning a first patterned photoresist layer 1304, wherein the first patterning comprises an exposure of a first pattern onto the photoresist; followed by a developing of the photoresist to form the first pattern. Embodiments, may further comprise a resist freeze of the first patterned photoresist layer 1304, so as to stabilize the first patterned photoresist 1304. FIG. 13B illustrates embodiments comprising: exposing the first patterned photoresist layer 1304 with a second mask; and then developing the first patterned photoresist layer 1304 to form a fully patterned photoresist layer 1314. FIG. 13C illustrates embodiments comprising transferring the fully patterned photoresist layer 1314 to the non-carbon-based film 1303 to form a fully patterned non-carbon-based film 1323. Embodiments of the double patterning methods as illustrated in FIG. 13A to 13C, and described above, may be applied to other embodiments, including but not limited to, those embodiments illustrated in FIGS. 2B to 2H.

Figure 14A:
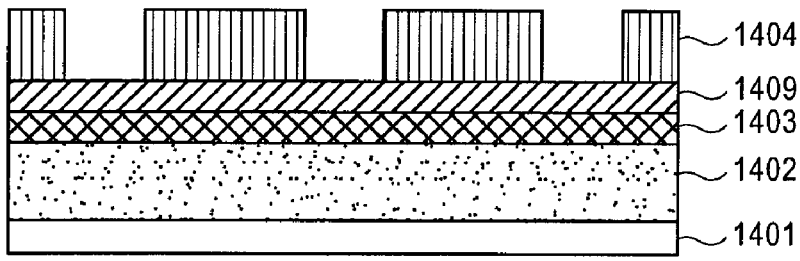
FIGS. 14A to 14F illustrate cross sectional views of embodiments of methods of patterning photoresist used for making an interconnect structure. Embodiments of patterning photoresist comprising first and second litho/etch double patterning methods are illustrated.
Figure 14B:
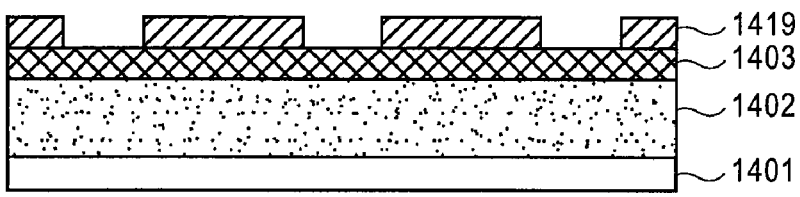
Figure 14C:
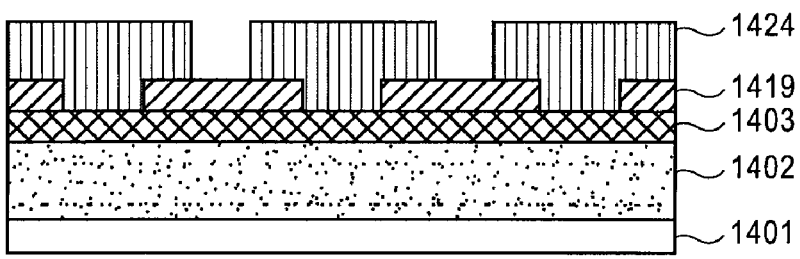
Figure 14D:
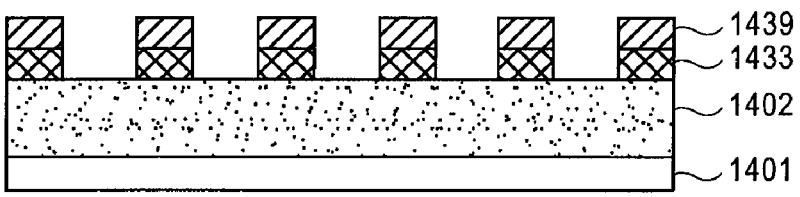
Figure 14E:
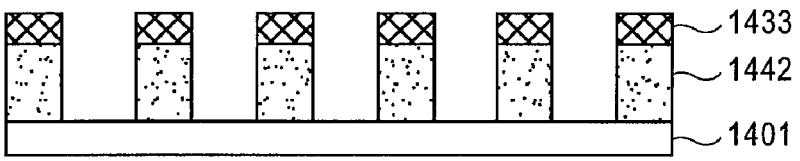
Figure 14F:
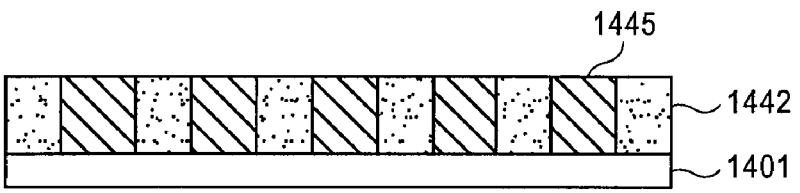

Embodiments of the double patterning method may comprise a first litho/etch and a second litho/etch method. FIGS. 14A to 14F illustrate embodiments of the first and second litho/etch method. Embodiments illustrated in FIG. 14A comprise: providing substrate 1401, a carbon-based film 1402, a non-carbon-based film 1403, and a hard mask layer 1409; and blanket depositing and patterning a first patterned photoresist layer 1404, wherein the first patterning comprises an exposure of a first pattern onto the photoresist; followed by a developing of the photoresist to form the first pattern. FIG. 14B illustrates embodiments comprising: transferring the first pattern into the hard mask layer 1409 to form a first patterned hard mask layer 1419; and removing the first patterned photoresist layer 1404, where in embodiments the transferring of the first pattern may be performed by etching the exposed hard layer 1409. FIG. 14C illustrates embodiments comprising blanket depositing and patterning a second patterned photoresist layer 1424, with a second mask having interconnect structures positioned between the interconnect structures formed in the first mask. FIG. 14D illustrates embodiments that may comprise transferring the second pattern of the second patterned photoresist layer 1424 to the first patterned hard mask layer 1419 to form a fully patterned hard mask layer 1439, wherein the transferring may be performed by etching the hard mask layer 1419; and then transferring the full pattern to the non-carbon based layer 1403 to form a fully patterned non-carbon based film 1433. FIG. 14E illustrates embodiments that may comprise: transferring the fully patterned non-carbon based film 1433 to the carbon-based film 1402 to form a fully patterned non-carbon-based film 1442; and removing the fully patterned hard mask layer 1439. Embodiments, illustrated in FIG. 14F, may further comprise blanket depositing a metal conductor, and then, planarizing to form a planarized metal conductor interconnect 1445 with the fully patterned carbon-based film 1442 positioned between the planarized metal conductor interconnects 1445; and removing the fully patterned non-carbon based film 1433. Embodiments of the double patterning methods as illustrated in FIG. 14A to 14F, and described above, may be applied to other embodiments, including but not limited to, those embodiments illustrated in FIGS. 2D to 2H.

Embodiments may further comprise patterning photoresist layers by a molecular imprinting method, which may provide very high density interconnect structures, which may benefit from a carbon-based sacrificial layer which can be easily and completely removed by an oxidizing method. Embodiments of the molecular imprinting method may comprise coating the structure with a polymer; imprinting the polymer with an imprint contact mask having the desired pattern; while imprinting, treating the polymer with ultra-violet radiation, and/or with heat, so as to polymerized the polymer, which may result in hardening the polymer having the imprinted pattern; and then removing the imprint contact mask from the surface of the polymerized polymer.

An embodiment may exclude planarizing the non-conformal dielectric layer, block 111, from the method, particularly if subsequent processing of the structure, if any, does not require a planarized surface. Embodiments may exclude the deposition of the metal barrier liner, block 109, from the method. In interconnect structures where electromigration of metal ions from the planarized metal structures into the non-conforming dielectric may not be problematic, the metal barrier layer may be optional. In embodiments, the metal conductor layer may comprise a metal and/or conductive compound selected from the group consisting of: copper, aluminum, tantalum, tungsten, titanium, tantalum nitride, titanium nitride, tungsten nitride, and any combination thereof. In an embodiment, wherein the conductive metal may comprise copper, a metal barrier liner may be advantageous. Copper may often be used for its low conductivity.

In embodiments, the non-carbon-based film may comprise a hard mask layer and/or a Dielectric Anti-Reflective Coating (DARC) layer. Further, the DARC layer may act as both a hard mask to protect sections of the carbon-based film during processing, and as an anti-reflective coating to aid in patterning photoresist. In embodiments, the non-carbon-based film may be selected to have good etch selectivity between the non-carbon based layer and the photoresist and/or carbon-based film materials. In an embodiment, the thickness of the non-carbon-based film may be between 50 Angstroms and 500 Angstroms. In one embodiment, the thickness of the non-carbon-based film may be at least 200 Angstroms. In embodiments, the hard mask may comprise a material selected from the group consisting of silicon nitride, poly silicon, silicon dioxide, amorphous silicon, boron nitride, and any combination thereof.

Figure 2A:
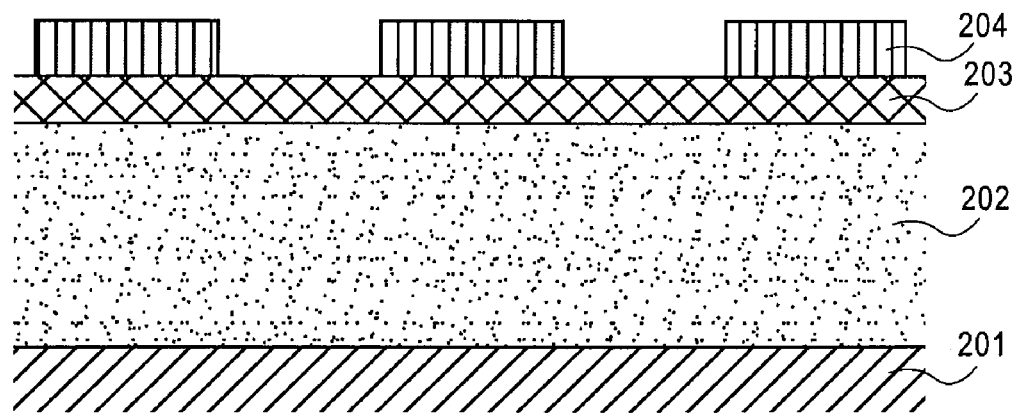
FIGS. 2A to 2H illustrate cross sectional views of embodiments of structures processed according to embodiments of methods of making an interconnect structure, which may be a single level interconnect having air gaps between the interconnect lines.
Figure 2B:
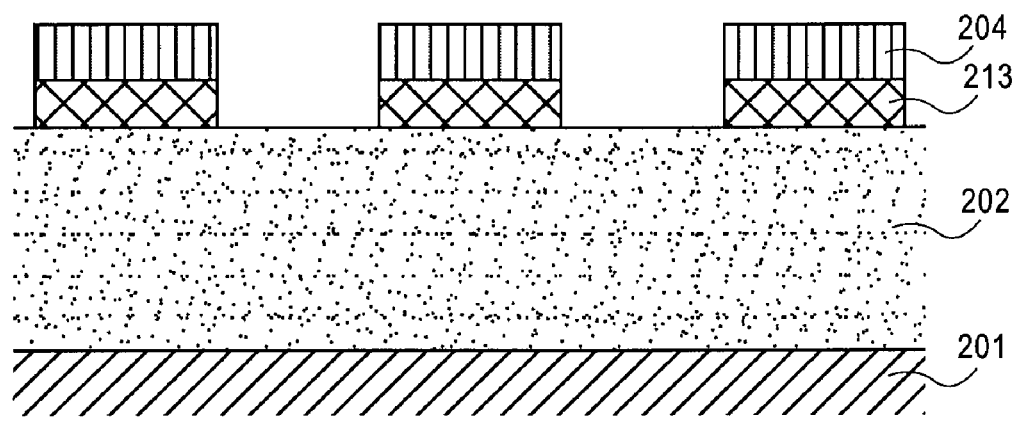
Figure 2C:
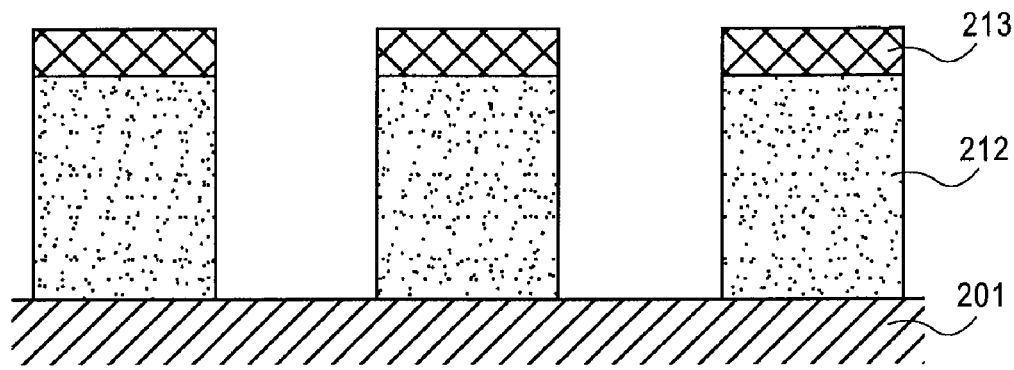

FIGS. 2A to 2H illustrate cross sectional views of embodiments of structures processed according to embodiments of methods of making an interconnect structure, which may be a single level interconnect having air gaps between the interconnect lines. FIGS. 2I to 2J illustrate cross-section views of embodiments related to a method of making an interconnect structure further comprising forming a metal suicide layer 221 on a planarized metal interconnect structure 205. FIGS. 2K to 2L illustrate cross-sectional views of embodiments related to a method of making an interconnect structure further comprising a selective metal deposition 221 on a planarized metal interconnect structure 205. FIG. 2A illustrates an embodiment providing a substrate 201 on which to form a single level interconnect structure. In embodiments, the substrate 201 may comprise semiconductor devices and/or other interconnect structures. In an embodiment, a carbon-based film 202 is blanket deposited over the substrate 201. In embodiments, the carbon-based film 202 may comprise a carbon-based material selected from the group consisting of: amorphous carbon, advanced patterning films (APF™) (available from Applied Materials, Inc. of Santa Clara, Calif.), porous carbon, and any combination thereof.

In embodiments, the method of making an interconnect structure further comprises blanket depositing a non-carbon-based film 203 over the carbon-based film 202. In embodiments, the non-carbon-based film 203 may comprise a hard mask layer and/or a DARC layer. In embodiments, the DARC layer may act as both a hard mask and as an anti-reflective coating to aid in patterning. In embodiments, the anti-reflective coating may control the reflection of light used to expose the photoresist during subsequent lithographic patterning processes. In embodiments, the non-carbon-based film 203 may comprise a plurality of layers having a Dielectric Anti-Reflective Coating (DARC) layer. Embodiments may provide that the non-carbon-based film 203 may comprise a hard mask material having a high etch selectivity in removal rates over photoresist and/or carbon-based film materials, so that the non-carbon-based film 203 preferentially protects the underlying carbon-based film 202. In embodiments, the non-carbon-based film 203 may comprise materials selected from the group consisting of: amorphous silicon, silicon nitride, silicon oxynitride, silicon oxide, doped silicon oxide, silicon oxycarbide, hafnium dioxide, carbides, silicon carbide, titanium, titanium nitride, and any combination thereof. In an embodiment, the non-carbon-based film 203 may comprise less than about 50 atomic % carbon.

FIG. 2A illustrates embodiments of methods of making an interconnect structure that may comprise blanket depositing and patterning a photoresist layer 204 over the non-carbon-based film 203, using conventional lithographic patterning processes. FIG. 2B illustrates embodiments that may further comprise transferring the patterned photoresist layer 204 into the non-carbon-based film 213. FIG. 2C illustrates embodiments that may further comprise: transferring the patterned non-carbon-based film 213 to the carbon-based film 212; and removing the patterned photoresist layer 204. In embodiments, the removing of the patterned photoresist layer 204 and the patterning of the carbon-based film 202, 212 may be performed substantially simultaneously. Performing both processes substantially simultaneously may provide the advantage of combining two process steps into one process step, thus reducing costs and increasing throughput. In embodiments, the method of removing the patterned photoresist layer 204 and the method of removing part of the carbon-based material to form the patterned carbon-based film 212, may comprise substantially the same method of removing. Since both methods of removing may be substantially the same, both methods may be performed on the same equipment and at substantially the same time, and thus, may have the advantage of reducing the complexity of equipment logistics, which may also reduce capital equipment costs.

In embodiments, the removing of the carbon-based film material may comprise treatment of the carbon-based film material with a plasma generated from a source gas comprising a gas selected from the group consisting of: ozone, oxygen, ammonia, hydrogen, and any combination thereof. In embodiments, the removing of the photoresist material may comprise treatment of the photoresist material with a plasma generated from a source gas comprising a gas selected from the group consisting of: ozone, oxygen, ammonia, hydrogen, and any combination thereof. In some embodiments, the removal of the carbon-based film material and/or the photoresist material may comprise treating the exposed carbon-based film 202 and/or the patterned photoresist layer 204 with a plasma generated from a source gas comprising a gas selected from the group consisting of: ozone, oxygen, ammonia, hydrogen, a fluorine containing gas, $NF_3$, $SF_6$, $CF_4$, and any combination thereof. In embodiments, the source gas may further comprise HBr, $N_2$, He, Ar, or any combination thereof.

Figure 2D:
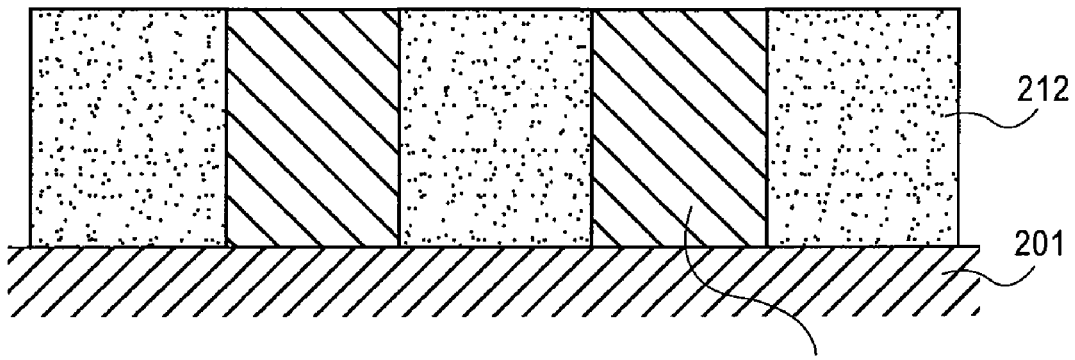

FIG. 2D illustrates embodiments that may further comprise: blanket depositing and then planarizing a metal conductor layer 205. In embodiments, the planarizing of the metal conductor layer 205 may comprise exposing the patterned carbon-based film 212. In embodiments, the planarized metal conductor layer 205 may comprise at least part of a plurality of interconnect lines of the interconnect structure. In embodiments, the metal conductor layer 205 may comprise a metal and/or conductive compound selected from the group consisting of: copper, aluminum, tantalum, tungsten, titanium, tantalum nitride, titanium nitride, tungsten nitride, and any combination thereof.

In an embodiment, the metal conductor layer 205 may comprise copper. In an embodiment, the copper conductor layer 205 may have a thickness between about 1000 Angstroms to about 5000 Angstroms. In embodiments, the deposition and planarization of the copper conductor layer 205 may further comprise metallizing trenches using a standard copper flow, wherein the standard copper flow may comprises depositing a barrier-seed layer (not shown); depositing a conductive metal; and then planarizing. In embodiments, the deposition of the barrier seed layer (not illustrated) may comprise a TaN/Ta bi-layer, wherein the TaN may provide better adhesion to the patterned carbon-based film 212. In embodiments, the barrier seed layer (not illustrated) may comprise a material selected from the group consisting of: TaN, Ta, TaRu, TiZr, TiZrN, Ti, Ru, and any combination thereof. In an embodiment, the patterned carbon-based film 212 may comprise amorphous carbon, wherein the TaN may provide good adhesion to the amorphous carbon. In an embodiment, the TaN/Ta bi-layer is formed on a patterned APF™ carbon-based film 212 (available from Applied Materials, Inc. of Santa Clara, Calif.), with an Endura™ deposition equipment (available from Applied Materials, Inc. of Santa Clara, Calif.).

In embodiments, the deposition of a conductive metal, such as copper, may comprise an electro-chemical plating (ECP) process. In embodiments, the deposition of a conductive metal, such as copper, may comprise an electroless copper deposition on a barrier seed layer. In embodiments, the deposition of a conductive metal, such as copper, may comprise a physical vapor deposition (PVD) process. In embodiments, the deposition of a conductive metal, such as copper, may comprise a chemical vapor deposition (CVD) process. In embodiments, the deposition of a conductive metal, such as copper, may comprise an atomic layer deposition (ALD) process. In embodiments, the deposition of a conductive metal, such as copper, may comprise a sputter deposition process.

In embodiments, the planarization process may comprise a chemical mechanical polish (CMP). In embodiments, the planarization process may comprise a full sequence electro-chemical mechanical polish (ECMP), wherein an electrical current is passed though a polishing slurry and the substrate being polished. In embodiments, the ECMP and/or CMP may be performed with a low down force so as to maintain structural integrity of the interconnect structure on the substrate, particularly in those structures having air gaps.

Figure 2E:
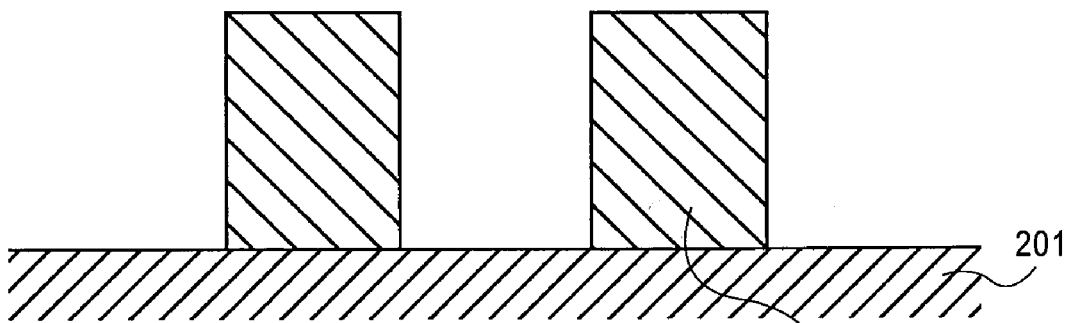

FIG. 2E illustrates embodiments that may further comprise: removing the patterned carbon-based film 212, whereby sidewalls of the planarized metal conductors 205 are exposed. In embodiments, the removing of the patterned carbon-based film 212 may comprise treatment of the patterned carbon-based film 212 with a plasma generated from a source gas comprising a gas selected from the group consisting of: ozone, oxygen, ammonia, hydrogen, and any combination thereof. In embodiments, the planarized metal conductor layer may comprise copper. In embodiments, the removal of the patterned carbon-based film 212 may comprise a highly reactive hydrogen radicals process to remove the patterned carbon-based film 212 and to pre-clean the surface of the interconnect structure for the deposition of a metal barrier liner, thus combining the removal and pre-clean processes into a single process on a single piece of equipment. In embodiments, the highly reactive hydrogen radicals process may comprise an Akiv™ pre-clean (equipment and processes available from Applied Materials, Inc. of Santa Clara, Calif.). In embodiments, the patterned carbon-based film 212 may comprise amorphous carbon and/or an advanced patterning films (APF™) (available from Applied Materials, Inc. of Santa Clara, Calif.). The combination of the Akiv™ pre-clean embodiment with the removal of the patterned APF™ layer embodiment, provides for a single process in a single process chamber to perform both operations, wherein the copper surface may not be damaged by either the APF™ or the Akiv™ pre-clean. A protected and undamaged copper surface may provide improved interface integrity for subsequent processing that may deposit conductive metals, which may be in electrical contact with the copper surface.

FIG. 2I illustrates embodiments wherein prior to the removal of the patterned carbon-based film 212, the method may further comprise a metal siliciding process to form a metal silicide layer 221 on the exposed metal surface on the top of the planarized metal conductor 205 prior to removing the patterned carbon-based film 212. In embodiments, the metal siliciding process may comprise a $SiH_4$ soak followed by a $NH_3$ plasma treatment of the exposed metal surface. In embodiments, the metal silicide layer 221 may protect the top of the silicided metal conductor 225 during the removal of the patterned carbon-based film 212. In embodiments, the planarized metal conductor 205 may comprise copper, the patterned carbon-based film 212 may comprise amorphous carbon and/or APF™, and the removal of the patterned carbon-based film 212 may comprise treatment with an oxygen plasma. FIG. 2J illustrates embodiments that may comprise the silicided metal conductor 225 after the removal of the patterned carbon-based film 212. In embodiments, further processing may comprise embodiments illustrated in FIGS. 2F to 2H.

FIG. 2K illustrates embodiments wherein prior to the removal of the patterned carbon-based film 212, the method may further comprise a selective metal deposition to form a selective metal cap 222 on the exposed metal surface on the top of the planarized metal conductor 205 prior to removing the patterned carbon-based film 212. In embodiments, the selective metal cap may comprise W and/or CoWP materials. In embodiments, the selective metal cap 222 may protect the top of the metal conductor 205 during the removal of the patterned carbon-based film 212. In embodiments, the planarized metal conductor 205 may comprise copper, the patterned carbon-based film 212 may comprise amorphous carbon and/or APF™, and the removal of the patterned carbon-based film 212 may comprise treatment with an oxygen plasma. FIG. 2L illustrates embodiments that may comprise the selected metal cap 222 on the planarized metal conductor 205 after the removal of the patterned carbon-based film 212. In embodiments, further processing may comprise embodiments illustrated in FIGS. 2F to 2H.

Figure 2F:
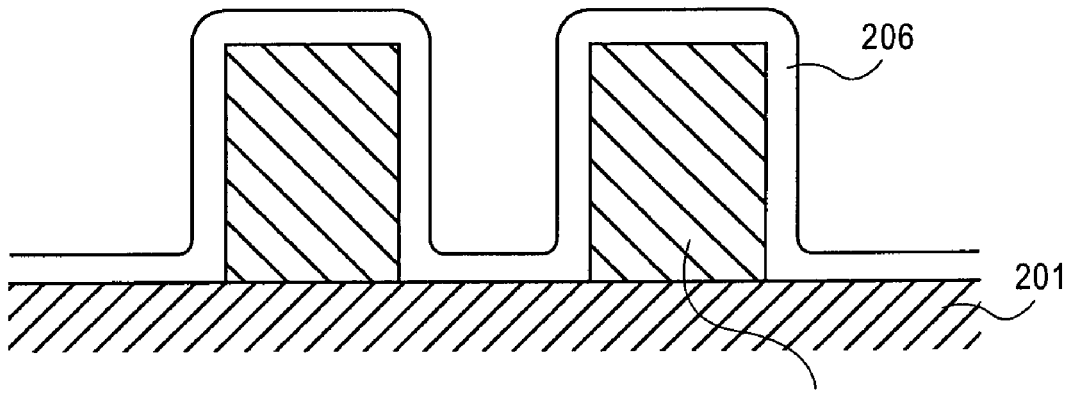

FIG. 2F illustrates embodiments that may further comprise: a conformal blanket deposition of a metal barrier liner 206 over the planarized metal conductors 205. In embodiments, the conformal deposition of the metal barrier liner 206, may be preceded with the highly reactive hydrogen radicals process that may have the advantage of providing efficient removal of polymeric residues and the reduction of copper oxide, while protecting and gently cleaning the copper surface of the interconnect structure. The highly reactive hydrogen radicals process may ensure interface integrity of the copper with the deposited metal barrier liner. Improved interface integrity may improve RC delays over previous reactive pre-clean technologies. In embodiments, the metal barrier liner 206 may be used as a CMP stop layer in subsequent planarization processes. In embodiments having a metal silicide layer 221 or a selective metal cap 222 on the metal conductors 205, 225, respectively, the metal barrier liner 206 may be optional and provide a via etch stop, which may be used when forming the next interconnect layer.

In embodiments, the metal barrier liner 206 may comprise a material selected from the group consisting of silicon carbide, amorphous silicon carbide, silicon nitride, silicon oxide, and any combination thereof. In embodiments, the metal barrier liner 206 may comprise a BLOk™ layer (available from Applied Materials, Inc. of Santa Clara, Calif.). In embodiments, the BLOk™ layer may comprise nitrogen, silicon, carbon, and/or hydrogen. In embodiments, the BLOk™ layer may comprise amorphous silicon carbide having a lower dielectric constant than silicon carbide. In embodiments, the metal barrier liner 206 may comprise a BLOk II™ layer and/or a BLOk III™ layer, both available from Applied Materials, Inc. of Santa Clara, Calif. In embodiments, the metal barrier liner 206 may be less than 1000 Angstroms in thickness.

Figure 2G:
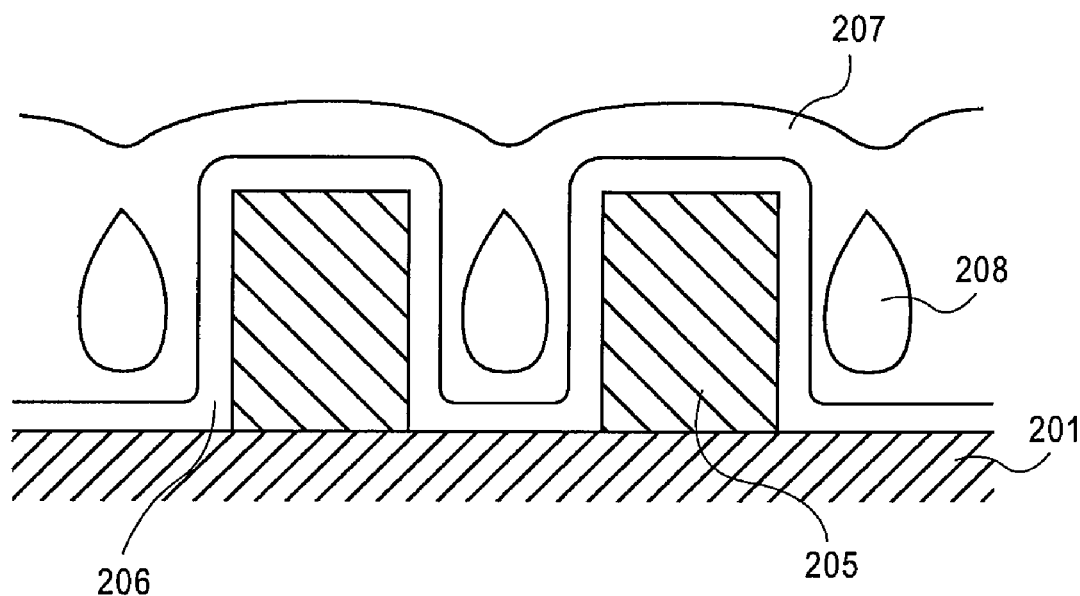
Figure 2H:
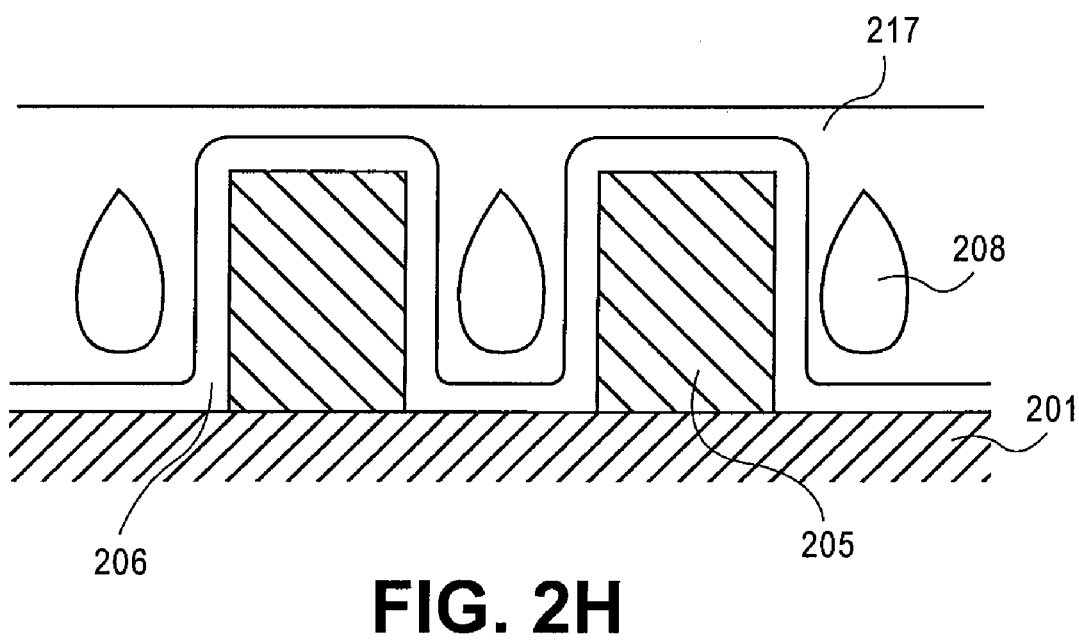
Figure 2I:
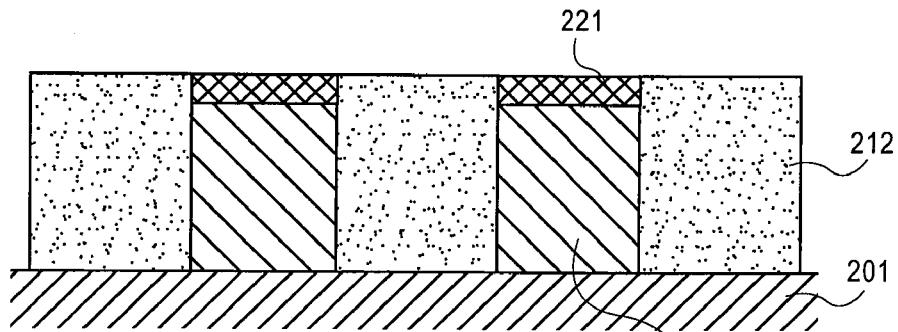
FIGS. 2I to 2J illustrate cross-sectional views related to embodiments further comprising a metal silicide layer on a metal interconnect.
Figure 2J:
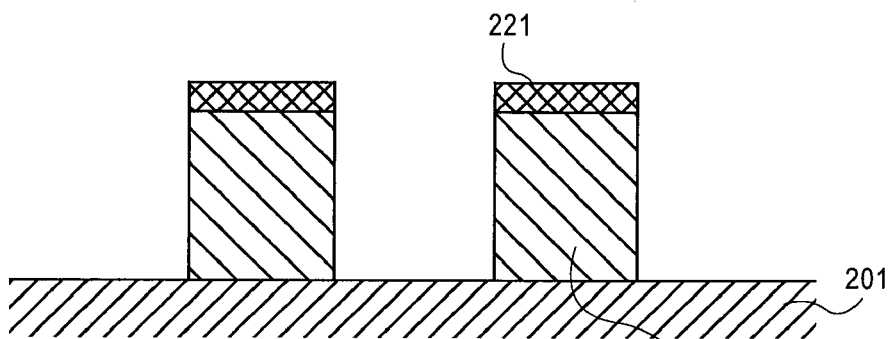
Figure 2K:
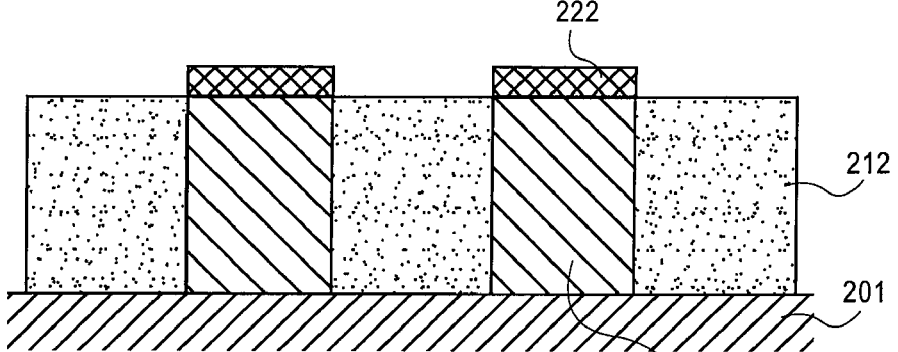
FIGS. 2K to 2L illustrate cross-sectional views related to embodiments further comprising a selective metal deposition on a metal interconnect.
Figure 2L:
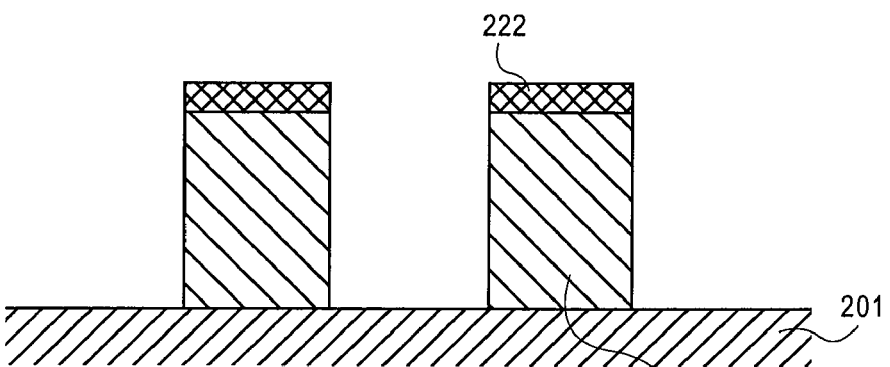

FIG. 2G illustrates embodiments that may further comprise: blanket depositing a non-conformal dielectric layer 207, wherein the non-conformal dielectric layer 207 forms air gaps 208 in the regions between the planarized metal conductors 205, which may comprise at least part of the interconnect lines of the interconnect structure. In embodiments, the non-conformal dielectric layer 207 may comprise a material selected from the group consisting of: a tetra-ethyl ortho silicate (TEOS) oxide, black diamond, porous black diamond, and any combination thereof. In embodiments, the non-conformal dielectric layer 207 may be formed by a chemical vapor deposition (CVD) process. FIG. 2H illustrates embodiments that may further comprise: planarizing the non-conformal dielectric layer 207, 217 having air gaps 208 in the regions between the metal conductors 205, wherein the air gaps 208 are completely engulfed within the planarized non-conformal dielectric layer 217. In embodiments, the planarizing process may comprise a CMP process. In embodiments, the air gaps 208 in the regions between the metal conductors 205 may help to reduce the capacitive coupling between the metal conductors 205, which may serve as interconnect lines.

Figure 3:
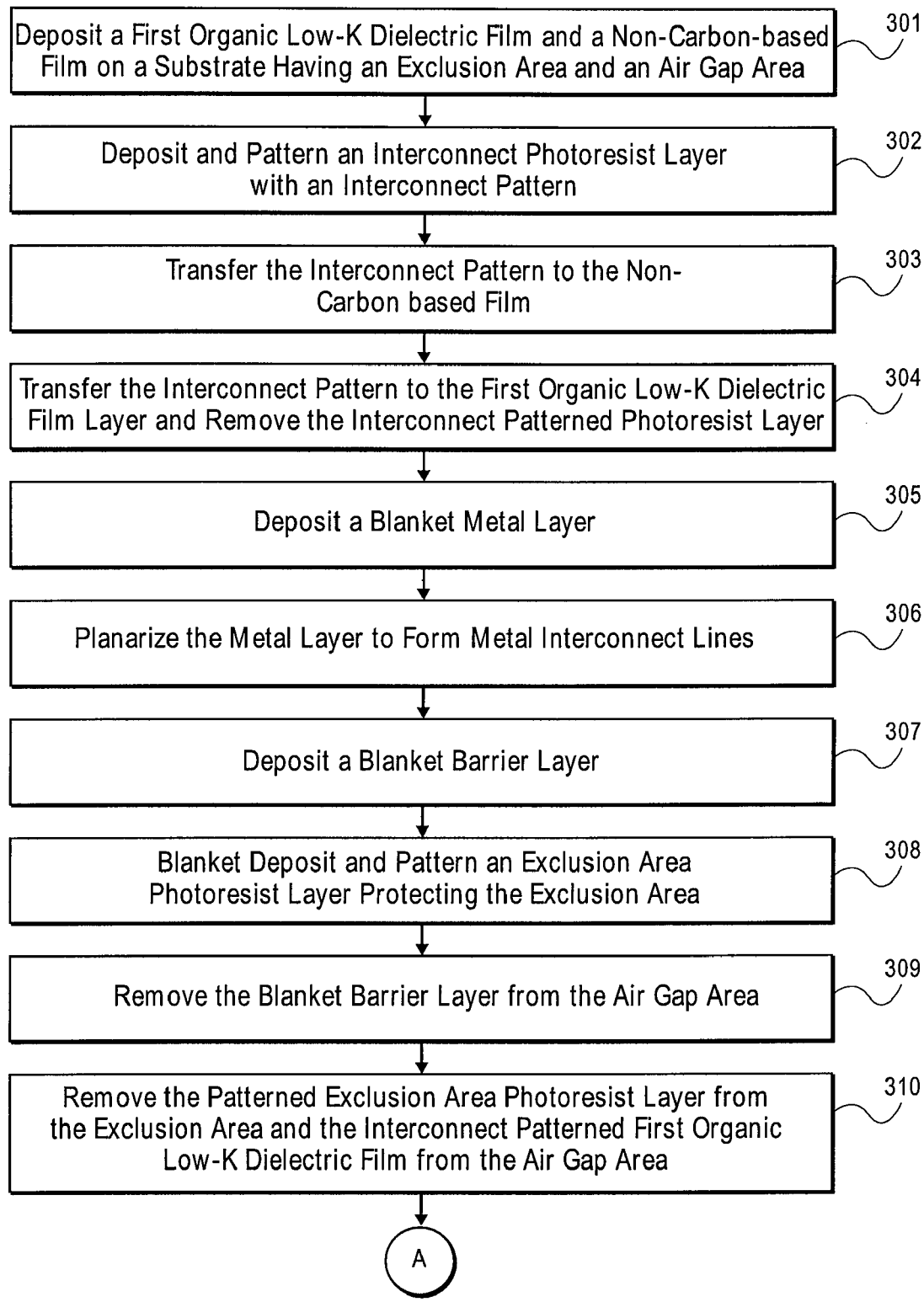
FIG. 3 illustrates a flowchart of embodiments of a method of making an interconnect structure, which may be a single level interconnect with air gap regions having air gaps between the interconnect lines, and with exclusion regions not having air gaps between the interconnect lines.
Figure 3:
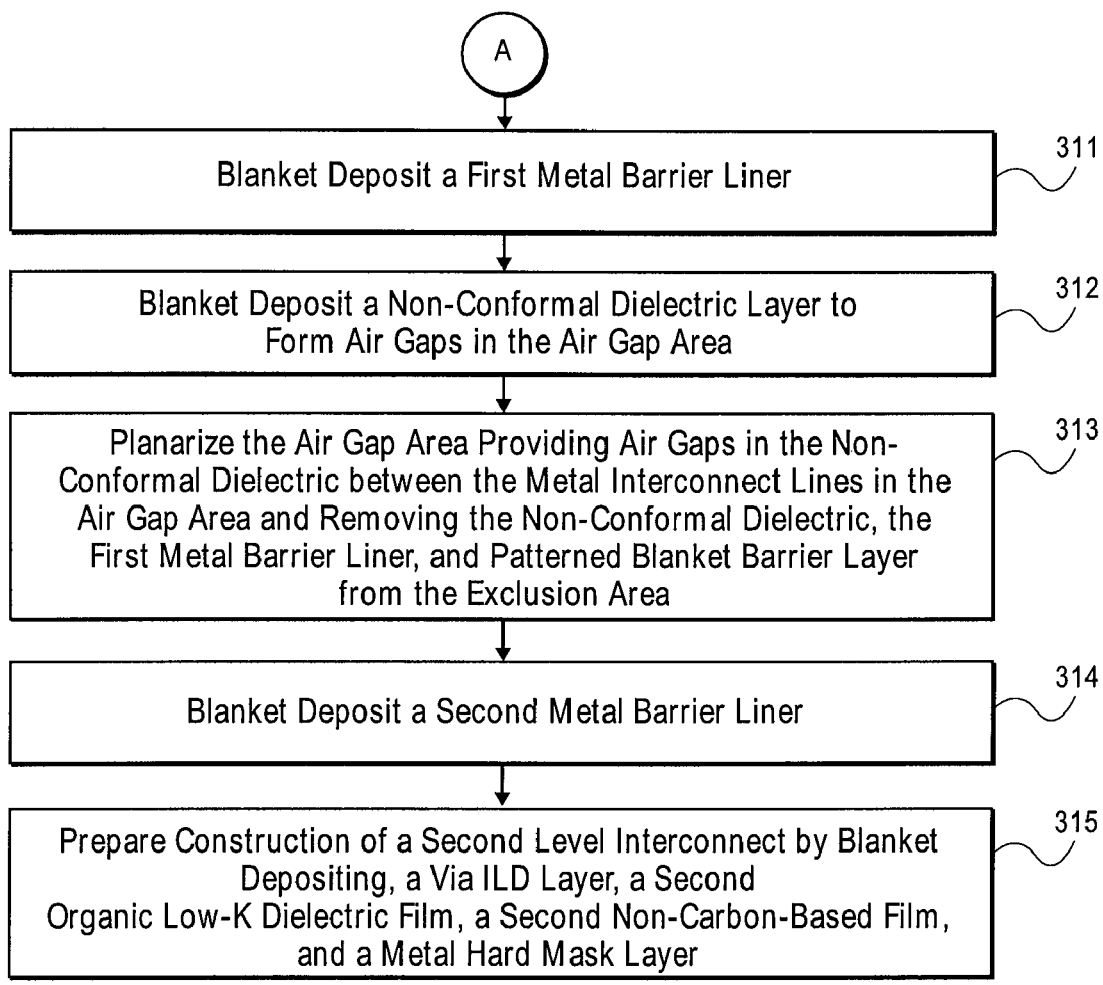

Embodiments, illustrated in FIG. 3, relate to a flowchart of a method of making an interconnect structure having a plurality of interconnect lines, wherein the interconnect structure may have air gaps between the interconnect lines in some areas and have some areas that may be excluded from having air gaps between the interconnect lines. In some embodiments, exclusions areas may help increase misalignment etch tolerance. Embodiments of a method of making may comprise forming a level of interconnect lines or structures on a substrate, having an exclusion area and an air gap area. Embodiments of the following methods may further comprise any and all embodiments previously described. Embodiments of the method of making an interconnect structure having exclusion and air gap areas may comprise: deposit a first organic low-k dielectric film and a non-carbon-based film on a substrate having an exclusion area and an air gap area, block 301; blanket depositing and patterning an interconnect photoresist layer with an interconnect pattern, block 302; transferring the interconnect pattern to the non-carbon-based film, block 303; and transferring the interconnect pattern to the first organic low-k dielectric film and removing the interconnect patterned photoresist layer, block 304. Similar to previously described embodiments, embodiments comprise the removal of sections of the first organic low-k dielectric film to form an interconnect pattern and the removal of the interconnect patterned photoresist layer, may be performed substantially simultaneously with substantially the same removal process, thus combining two processing operations into a single processing operation. In embodiments, the removal process may comprise a process selected from a group consisting of: an oxygen plasma process, an ashing process, an oxygen-based chemistry process, an Akiv™ pre-clean process, and any combination thereof. In embodiments, the oxygen-based chemistry process may comprise gases selected from the group consisting of: $O_2$, $SO_2$, $CO_2$, CO, and any combination thereof.

Embodiments of the method of making an interconnect structure having exclusion and air gap areas may further comprise: depositing a blanket metal layer, block 305; planarizing the metal layer to form metal interconnect lines, block 306; and blanket depositing a blanket barrier layer, block 307. Embodiments may comprise previously described embodiments wherein alternatively, either the exposed metal surface may be silicided or a selective metal cap may be deposited thereupon, so as to protect the metal surface. Embodiments may also comprise forming the silicided metal surface and/or depositing the selected metal cap.

Embodiments of the method of making an interconnect structure having exclusion and air gap areas may further comprise: blanket depositing and patterning an exclusion area photoresist layer, so as to protect the exclusion area, block 308; removing the blanket barrier layer from the air gap area, block 309; and removing the second exclusion area photoresist layer from the exclusion area and the interconnect patterned first organic low-k dielectric film from the air gap area, block 310. Similar to previously described embodiments, embodiments comprise the removal of sections of the interconnect patterned first organic low-k dielectric film from the air gap area and the removal of the patterned exclusion area photoresist layer, may be performed substantially simultaneously with substantially the same removal process, thus combining two processing operations into a single processing operation.

Embodiments of the method of making an interconnect structure having exclusion and air gap areas may further comprise: blanket depositing a first metal barrier liner, block 311; blanket depositing a non-conformal dielectric layer to form air gaps in the air gap area, block 312; and planarizing the air gap area having air gaps in the non-conformal dielectric between the metal interconnect lines in the air gap area and removing all or part of the non-conformal dielectric, the first metal barrier liner, and patterned blanket barrier layer from the exclusion area, block 313.

Embodiments of the method of making an interconnect structure having exclusion and air gap areas may further comprise: blanket depositing a second metal barrier liner, block 314; and optionally preparing construction of a second level interconnect by blanket depositing a second barrier layer, a via Inter-Level Dielectric (ILD) layer, a second organic low-k dielectric film, a second non-carbon-based film, and a metal hard mask layer, block 315. Embodiments may comprise an inter-metal dielectric stack between interconnect levels, wherein the inter-metal dielectric stack may comprise an Undoped Spin-on Glass (USG), a BLOk™ layer, an APF™ layer, and a DARC™ layer. In embodiments, an inter-metal dielectric stack may comprise a low k dielectric, a barrier layer, an amorphous carbon layer, and an anti-reflective hard mask dielectric layer.

Embodiments, illustrated in FIGS. 4A to 4I, relate to cross-sectional views of structures of embodiments of methods of making an interconnect structure having a plurality of interconnect lines, wherein the interconnect structure may have air gaps between the interconnect lines in some areas and have some exclusion areas that may have reduced or no air gaps between the interconnect lines. In embodiments, the interconnect structures may have an exclusion area and an air gap area. Embodiments of the following methods may further comprise part of any and all embodiments previously described in combination with the following embodiments of making an interconnect structure having exclusion and air gap areas.

Figure 4A:
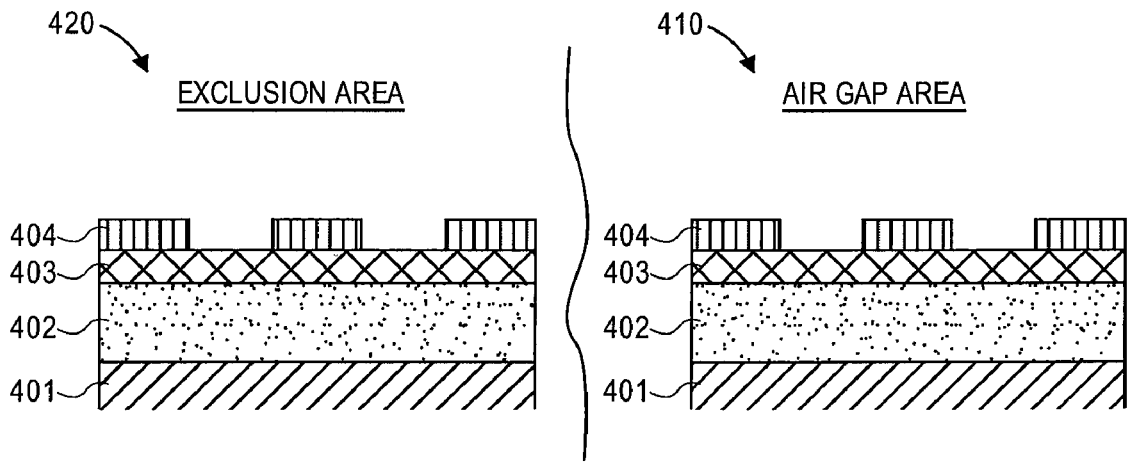
FIGS. 4A to 4I illustrate cross sectional views of embodiments of structures processed according to embodiments of a method of making an interconnect structure, which may be a single level interconnect with air gap regions having air gaps between the interconnect lines, and with exclusion regions not having air gaps between the interconnect lines.

FIG. 4A illustrates embodiments of methods of making an interconnect structure having exclusion and air gap areas that may comprise: providing a substrate 401 having an air gap area 410 and an exclusion area 420, wherein the interconnect structure is to be formed onto the substrate 401. The method further comprises blanket depositing a first organic low-k dielectric film 402 over the substrate 401 and a non-carbon-based film 403 over the first organic low-k dielectric film 402, wherein embodiments the organic low-k dielectric material has good electrical isolation properties, and a dielectric constant less than 3.0, and wherein embodiments the organic low-k dielectric material is a spin-on dielectric material; and blanket depositing and patterning an interconnect photoresist layer 404 with an interconnect pattern. In embodiments, the non-carbon-based film 403 may comprise one or more films that may provide the function of an anti-reflection coating, in addition to functioning as a hard mask.

Figure 4B:
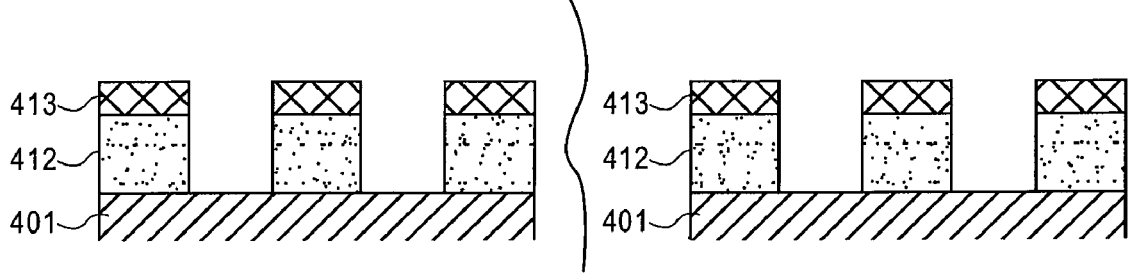

FIG. 4B illustrates embodiments that may further comprise: transferring the interconnect pattern to the non-carbon-based film 403; transferring the interconnect pattern to the first organic low-k dielectric film 402; and removing the interconnect patterned photoresist layer 404. Similar to previously described embodiments, embodiments may comprise the removal of sections of the first organic low-k dielectric film 402 and the removal of the interconnect patterned photoresist layer 404, may be performed substantially simultaneously with substantially the same removal process, thus combining two processing operations into a single processing operation.

Figure 4C:
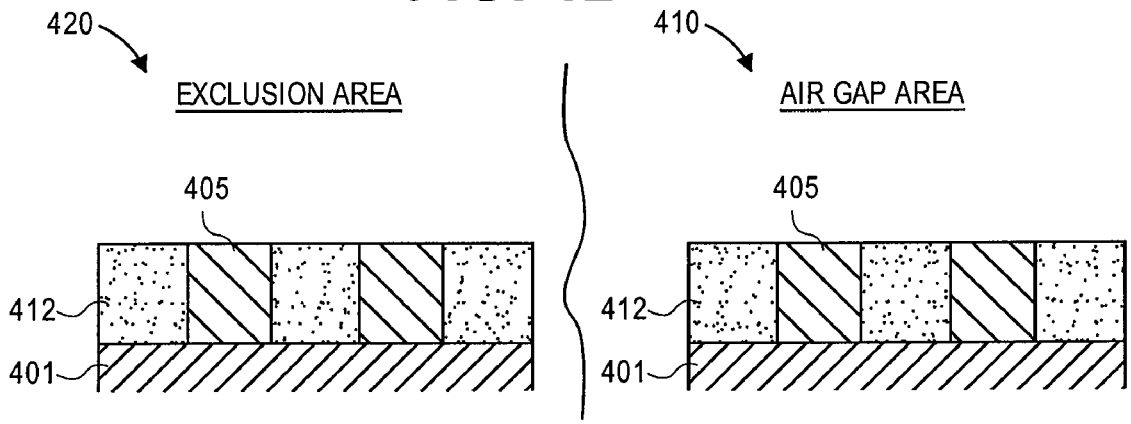
Figure 4D:
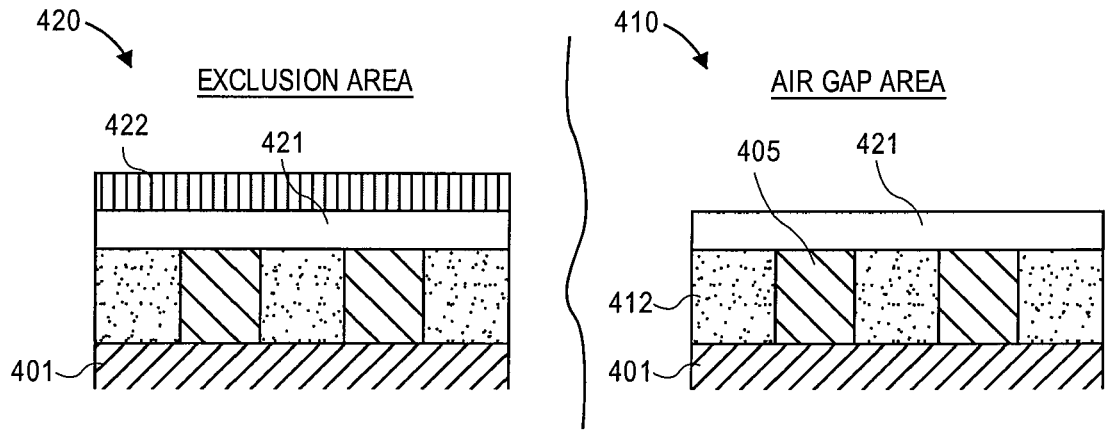
Figure 4E:
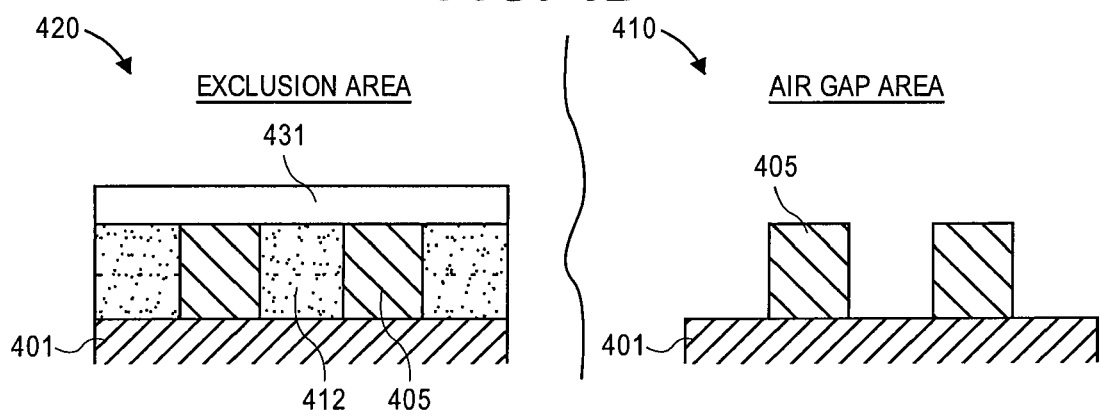

FIG. 4C illustrates embodiments that may further comprise: blanket depositing and planarizing a metal layer 405 to form planarized metal interconnect lines 405. FIG. 4D illustrates embodiments that may further comprise: blanket depositing a blanket barrier layer 421; and blanket depositing and patterning an exclusion area photoresist layer 422 to protect the exclusion area 420. FIG. 4E may illustrate embodiments that may further comprise: removing the blanket barrier layer 421 from the air gap area 410; removing the patterned exclusion area photoresist layer 422 from the exclusion area 420; and removing the first patterned organic low-k dielectric film 412 from the air gap area 410. Similar to previously described embodiments, embodiments may comprise the removal of the first patterned organic low-k dielectric film 412 and the removal of the patterned exclusion area photoresist layer 422 from the exclusion area 420, may be performed substantially simultaneously with substantially the same removal process, thus combining two processing operations into a single processing operation.

Figure 4F:
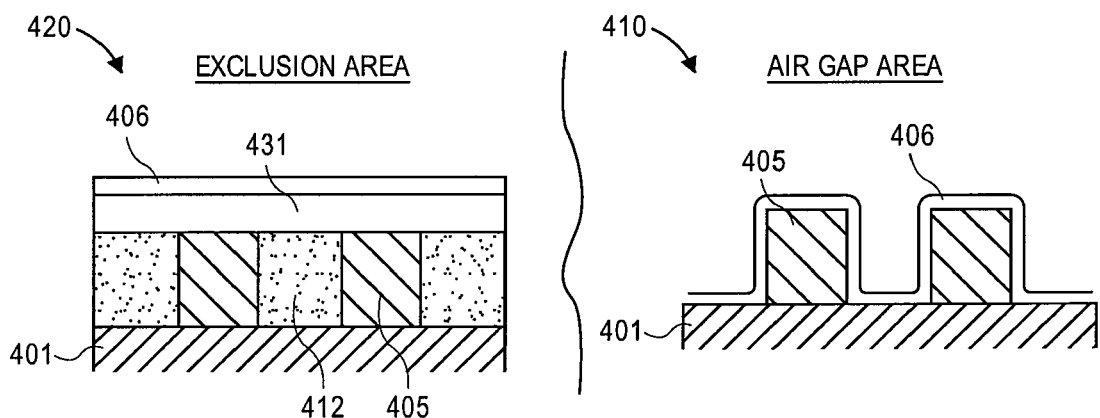
Figure 4G:
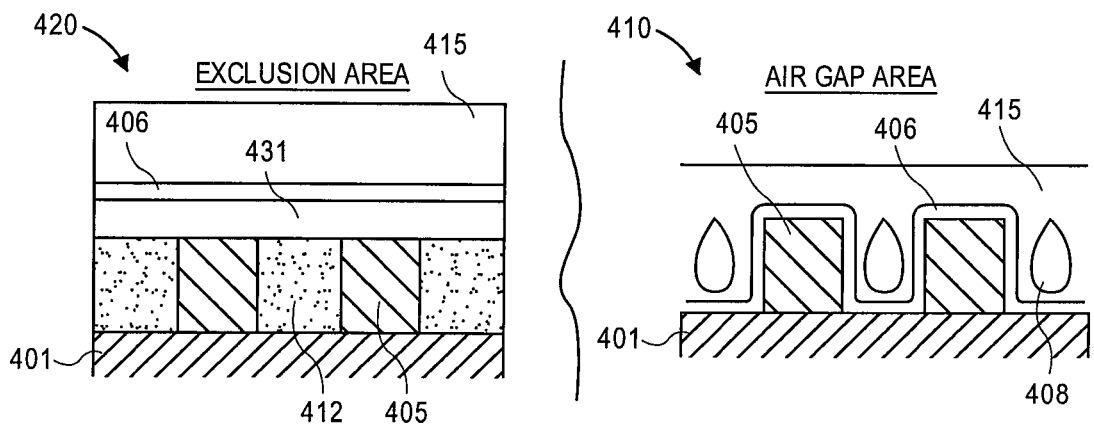

FIG. 4F illustrates embodiments that may further comprise: blanket depositing a first metal barrier liner 406. Similar to previously described embodiments, embodiments may comprise a highly reactive hydrogen radicals process to pre-clean the surface of the interconnect structure for the deposition of a metal barrier liner. In embodiments, the removal of the first patterned organic low-k dielectric film 412 in the air gap area 410 may comprise a highly reactive hydrogen radicals process to remove the patterned carbon-based film 412 and to pre-clean the surface of the interconnect structure for the deposition of the first metal barrier liner 406, thus combining the removal and pre-clean processes into a single process on a single piece of equipment. In embodiments, the highly reactive hydrogen radicals process may comprise an Akiv™ pre-clean (equipment and processes available from Applied Materials, Inc. of Santa Clara, Calif.). In embodiments, the first patterned organic low-k dielectric film 412 may comprise a material suitable to be permanently retained in the interconnect structure, where in embodiments the organic low-k dielectric material has good electrical isolation properties, which includes but is not limited to low leakage current properties and a dielectric constant less than 3.0. In embodiments, the organic low-k dielectric material may comprise a spin-on organic low-k dielectric material FIG. 4G illustrates embodiments that may further comprise: blanket depositing a non-conformal dielectric layer 415 to form air gaps 408 in the air gap area 410, wherein the air gaps 408 are positioned between the planarized metal interconnect lines 405. In embodiments, the non-conformal dielectric layer 415 may comprises a non-conformal chemical vapor deposition (CVD) dielectric layer, wherein the process to form the non-conformal CVD dielectric layer comprises a chemical vapor deposition (CVD) process.

Figure 4H:
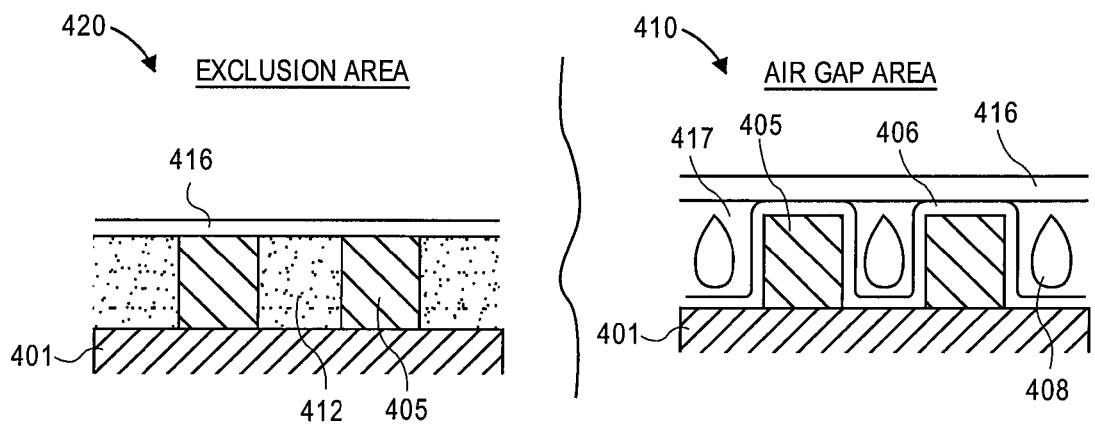

FIG. 4H illustrates embodiments that may further comprise: planarizing the substrate 401, wherein planarizing the non-conformal dielectric layer 415 in the air gap area 410, preserves air gaps 408 in the planarized non-conformal dielectric 417 between the metal interconnect lines 405, and wherein planarizing the non-conformal dielectric layer 415 in the exclusion area 420 removes all or part of the non-conformal dielectric 415, the first metal barrier liner 406, and the patterned blanket barrier layer 431 from the exclusion area 420; and blanket depositing a second metal barrier liner 416.

In embodiments, the first and second metal barrier liners 406 and 416 may comprise a dielectric material, which in embodiments may be effective in reducing the migration of metal atoms and/or ions from the metal interconnect lines into the dielectric material adjacent the metal interconnect lines 405. In embodiments, the first and second metal barrier liners 406 and 416 may comprise a material selected from the group consisting of silicon carbide, amorphous silicon carbide, silicon nitride, silicon oxide, a BLOk™ layer, and any combination thereof. In embodiments, a second barrier layer 441 may be blanket deposited over the second metal barrier liner 416, wherein the second barrier layer 441 may comprise a BLOk™ layer.

Figure 4I:
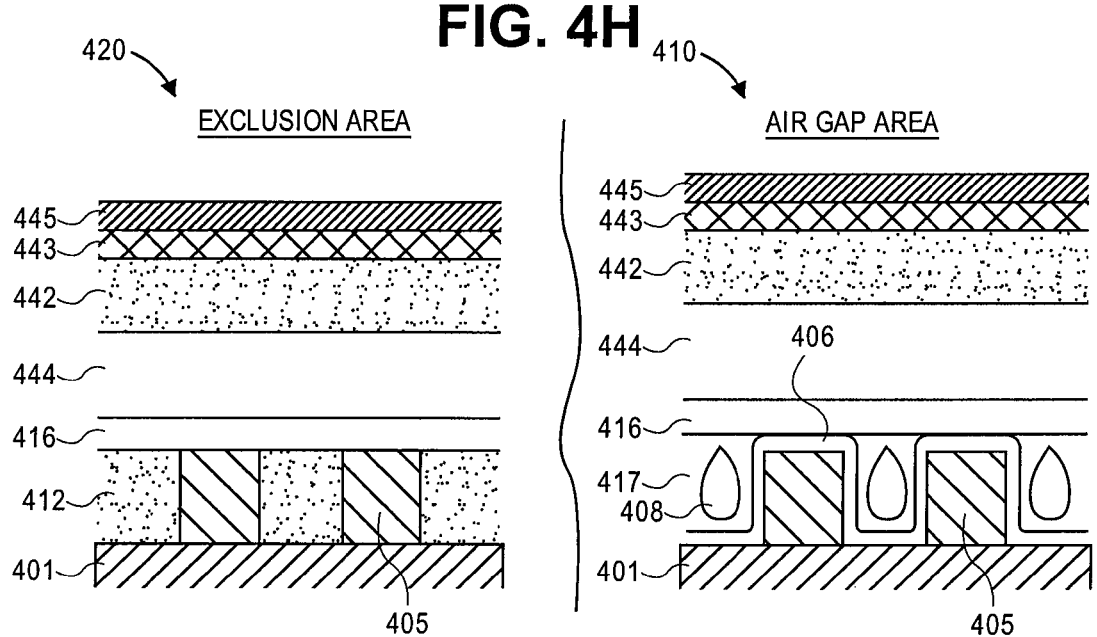

FIG. 4I illustrates embodiments that may further comprise: preparation for construction of a second level interconnect structure comprising: blanket depositing a via Inter-Layer Dielectric (ILD) layer 444, a second level carbon-based film 442, which may comprise an organic low-k dielectric, depending upon the isolation needs of the second level interconnect structure, a second non-carbon-based film 443, and a metal hard mask layer 445. In embodiments, the ILD layer 444 may comprise a dielectric material selected from the group consisting of an Undoped Silicon Glass (USG) layer, FluoroSilicated Glass (FSG), SiCOH, carbon doped glass, porous carbon doped glass, spin-on dielectrics, and any combinations thereof. In embodiments, the second carbon-based film 442 may comprise an amorphous carbon layer and/or an APF™ layer. In embodiments, the second barrier layer 441 may comprise a material selected from the group consisting of silicon carbide, amorphous silicon carbide, silicon nitride, silicon oxide, and any combination thereof. In embodiments, the second barrier layer 441 may comprise a BLOk™ layer. In embodiments, the second level carbon-based film 412 may comprise amorphous carbon and/or an advanced patterning film (APF™) (available from Applied Materials, Inc. of Santa Clara, Calif.).

Figure 5:
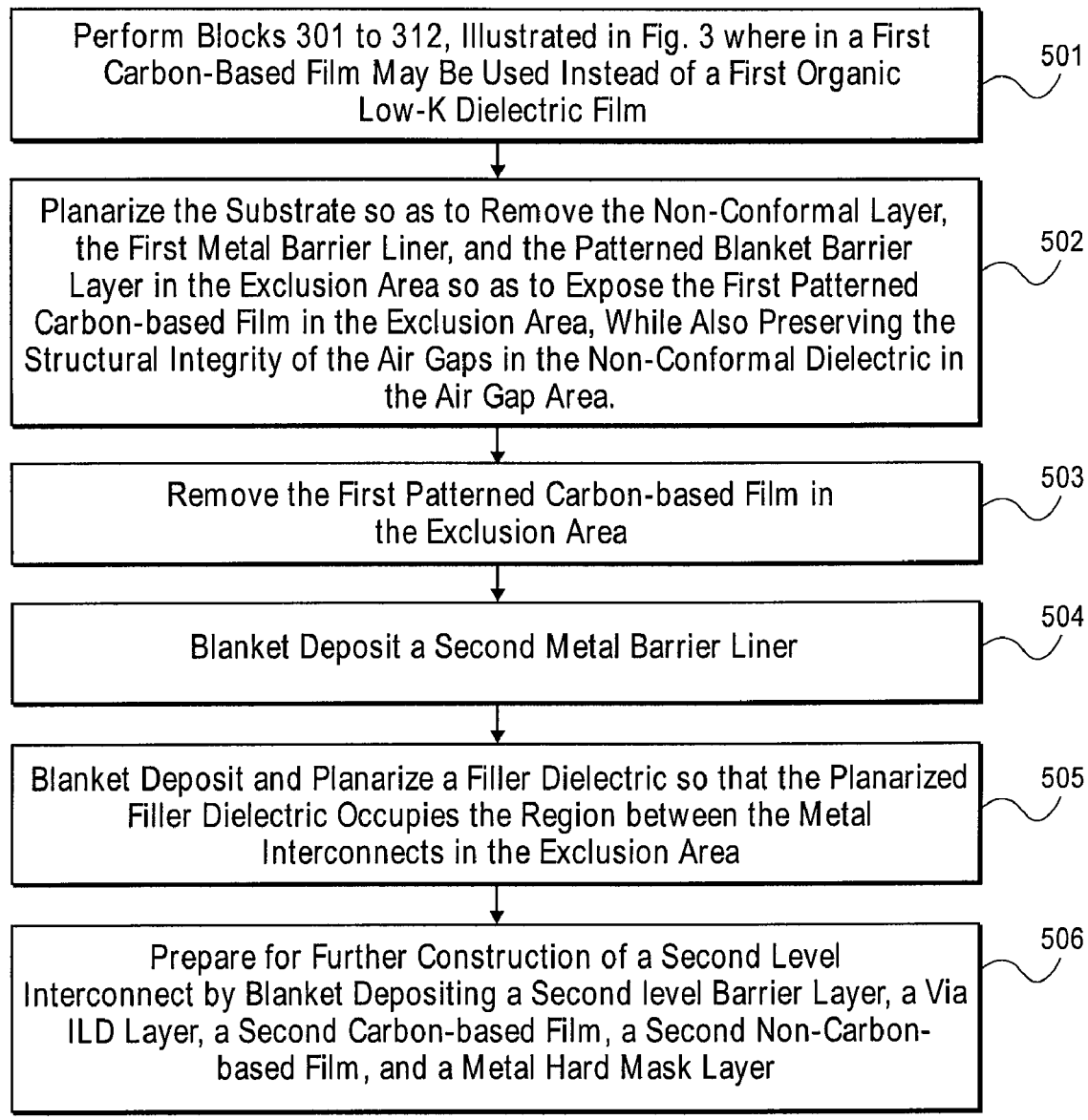
FIG. 5 illustrates a flowchart of embodiments of a method of making an interconnect structure, which may be a single level interconnect with air gap regions having air gaps between the interconnect lines, and with exclusion regions not having air gaps between the interconnect lines.

Embodiments, illustrated in FIG. 5, relate to a flowchart of a method of making an interconnect structure having a plurality of interconnect lines, wherein the interconnect structure may have air gaps between the interconnect lines in air gap areas and exclusion areas that may have reduced or no air gaps between the interconnect lines. Embodiments, illustrated in FIG. 5, relate to a method of making an interconnect substrate, which may be similar to the embodiments illustrated in FIG. 3, up to and including block 312. However, the embodiments illustrated in FIG. 5, may use a first carbon-based film instead of a first organic low-k dielectric film 402 and 412. In embodiments illustrated in FIG. 3, the first patterned organic low-k dielectric film 412 is permanently retained in the interconnect structure in the exclusion area. Therefore, in embodiments, the organic low-k dielectric material is selected to have good electrical isolation properties, suitable for permanent incorporation into the interconnect structure. In embodiments, illustrated in FIG. 5, the first carbon-based film is a sacrificial film, which would eventually be removed and not permanently incorporated into the interconnect structure. Consequently, the first carbon-based film may comprise materials selected from the group consisting of: amorphous carbon, advanced patterning films (APF™) (available from Applied Materials, Inc. of Santa Clara, Calif.), porous carbon, spin-on organic low-k dielectric materials, organic low-k dielectrics, and any combination thereof. In embodiments, the APF™ films may comprise an amorphous carbon layer that may comprise carbon and hydrogen. Embodiments in FIG. 5 may comprise a first carbon-based film that is easily removed by oxidation and/or ashing the carbon-based film. Since the first carbon-based film is a sacrificial film, in embodiments, it may or may not include organic low-k dielectric materials. Embodiments of the following methods may further comprise any and all embodiments previously described.

Embodiments of the method of making an interconnect structure having exclusion and air gap areas, with a sacrificial, easily removed, first carbon-based film rather than in embodiments related to FIG. 3 having a permanent, electrically isolating, first organic low-k dielectric film. The method may comprise: performing blocks 301 to 312, Illustrated in FIG. 3, wherein a first carbon-based film may be used instead of a first organic low-k dielectric film, block 501; planarizing the substrate so as to remove the non-conformal layer, the first metal barrier liner, and the patterned blanket barrier layer in the exclusion area so as to expose the first patterned carbon-based film in the exclusion area, while also preserving the structural integrity of the air gaps in the non-conformal dielectric in the air gap area, block 502; removing the first patterned carbon-based film in the exclusion area, block 503; blanket depositing a second metal barrier liner, block 504; blanket depositing and planarizing a filler dielectric so that the planarized filler dielectric occupies the regions between the metal interconnects in the exclusion area, block 505; and optionally preparing for further construction of a second level interconnect by blanket depositing a second level barrier layer, a via ILD layer, a second carbon-based film, a second non-carbon-based layer, and a metal hard mask layer, block 506.

Embodiments, illustrated in FIGS. 6A to 6E, relate to cross-sectional views of structures of embodiments of methods of making an interconnect structure having a plurality of interconnect lines, wherein the interconnect structure may have air gaps between the interconnect lines in air gap areas and exclusion areas that may have reduced or no air gaps between the interconnect lines. Embodiments of the following methods may further comprise part of any and all embodiments previously described in combination with the following embodiments of making an interconnect structure having exclusion and air gap areas. Embodiments illustrated in FIGS. 6A to 6E, may relate to a method, which uses a sacrificial, easily removed, first carbon-based film instead of a permanent, electrically isolating, first organic low-k dielectric film that may be in embodiments illustrated in FIGS. 4H to 4L.

Figure 6A:
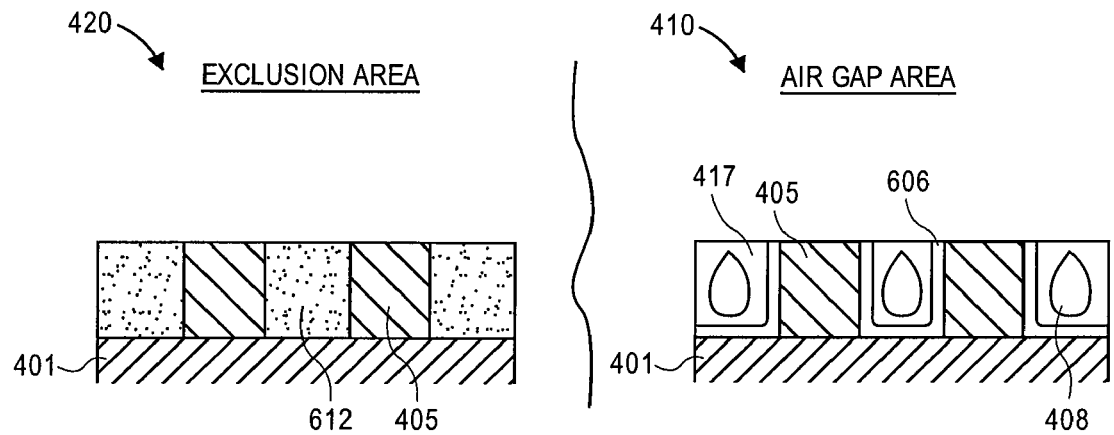
FIGS. 6A to 6E illustrate cross sectional views of embodiments of structures processed according to embodiments of a method of making an interconnect structure, which may be a single level interconnect with air gap regions having air gaps between the interconnect lines, and with exclusion regions not having air gaps between the interconnect lines.

FIG. 6A illustrates embodiments of methods of making an interconnect structure having exclusion and air gap areas that may comprise embodiments illustrated in FIG. 4g and further comprising: planarizing the substrate 401, thereby removing the non-conformal dielectric layer 415, the first metal barrier liner 406, and the patterned blanket barrier layer 431 in the exclusion area 420 so as to expose the first patterned carbon-based film 612 in the exclusion area 420, while also preserving the structural integrity of the air gaps 408 in the planarized non-conformal dielectric 417 in the air gap area 410. In embodiments, the planarization further comprises forming a planarized first metal barrier liner 606 in the air gap area 410.

Figure 6B:
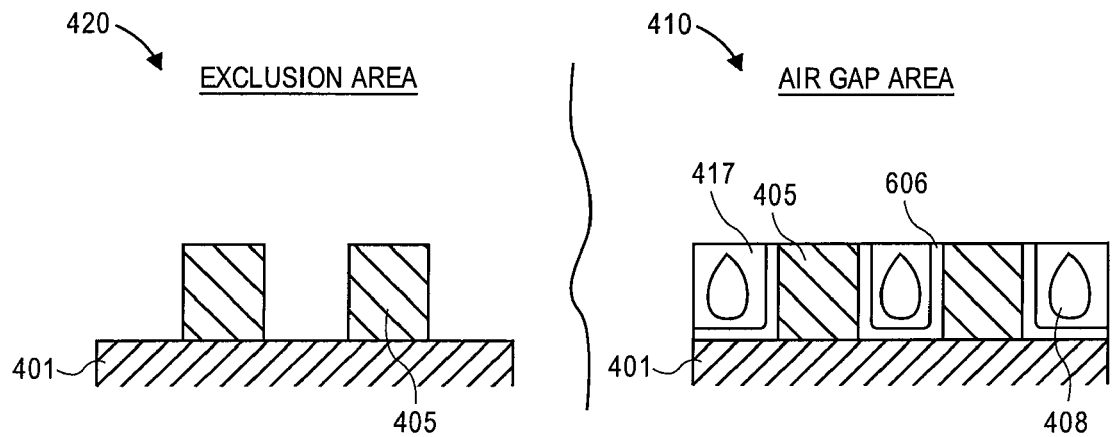
Figure 6C:
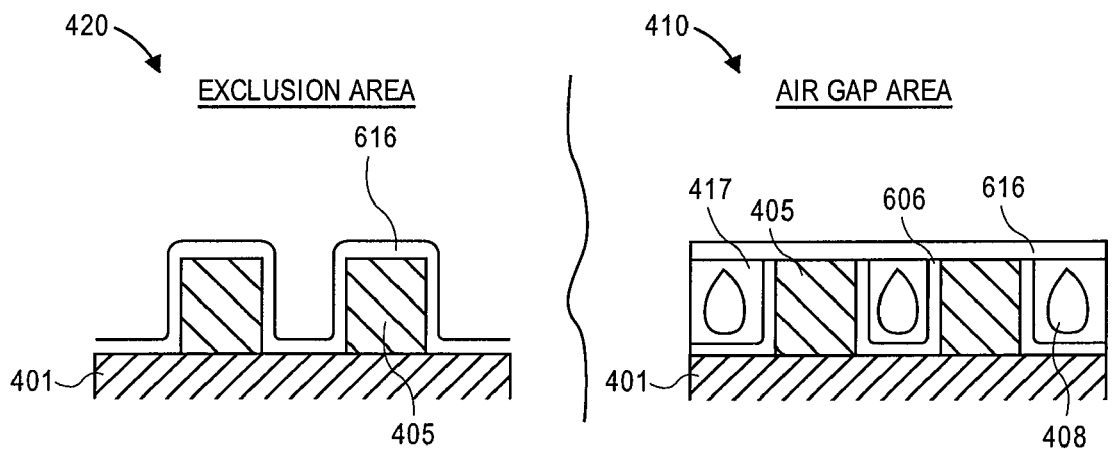

FIG. 6B illustrates embodiments that may further comprise removing the first patterned carbon-based film 612 in the exclusion area 420. In embodiments, the removal of the patterned carbon-based film 612 in the exclusion area 410 may comprise a highly reactive hydrogen radicals process to remove the patterned carbon-based film 612 and to pre-clean the surface of the interconnect structure for the subsequent deposition of a second metal barrier liner 616, illustrated in FIG. 6C, thus combining the removal and pre-clean processes into a single process on a single piece of equipment. Embodiments, illustrated in FIG. 6C, may comprise blanket depositing a second metal barrier liner 616.

Similar to previously described embodiments, embodiments may comprise a highly reactive hydrogen radicals process to pre-clean the surface of the interconnect structure for the deposition of a metal barrier liner, wherein the metal barrier liner is a dielectric that substantially reduces the migration of metal ions and/or atoms through the metal barrier liner and into the surrounding dielectric used for electrically isolating the metal interconnect lines from each other. In embodiments, the removal of the first patterned carbon-based film 612 in the air gap area 410 may comprise a highly reactive hydrogen radicals process to remove the patterned carbon-based film 612 and to pre-clean the surface of the interconnect structure for the deposition of the second metal barrier liner 616, thus combining the removal and pre-clean processes into a single process on a single piece of equipment. In embodiments, the highly reactive hydrogen radicals process may comprise an Akiv™ pre-clean (equipment and processes available from Applied Materials, Inc. of Santa Clara, Calif.). In embodiments, the patterned carbon-based film 612 may comprise amorphous carbon and/or an advanced patterning film (APF™) (available from Applied Materials, Inc. of Santa Clara, Calif.).

Figure 6D:
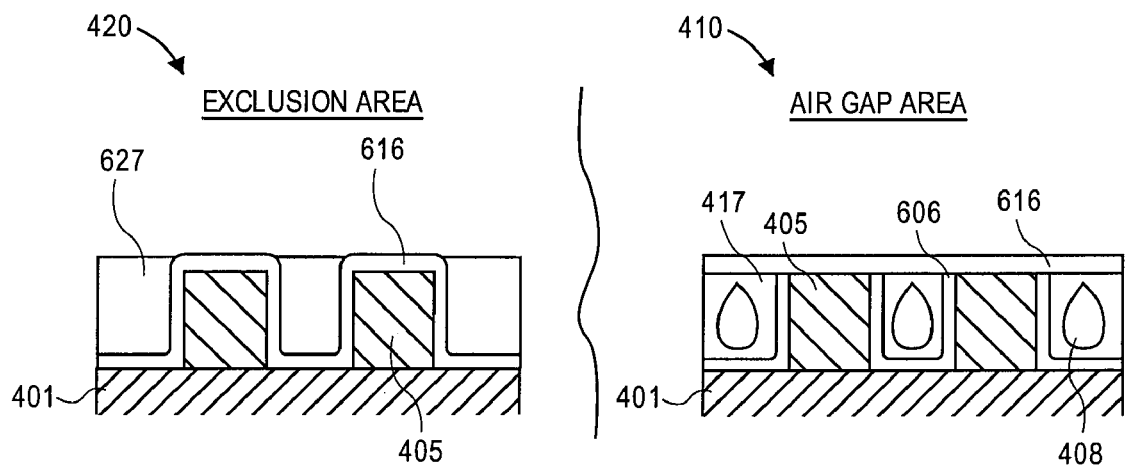
Figure 6E:
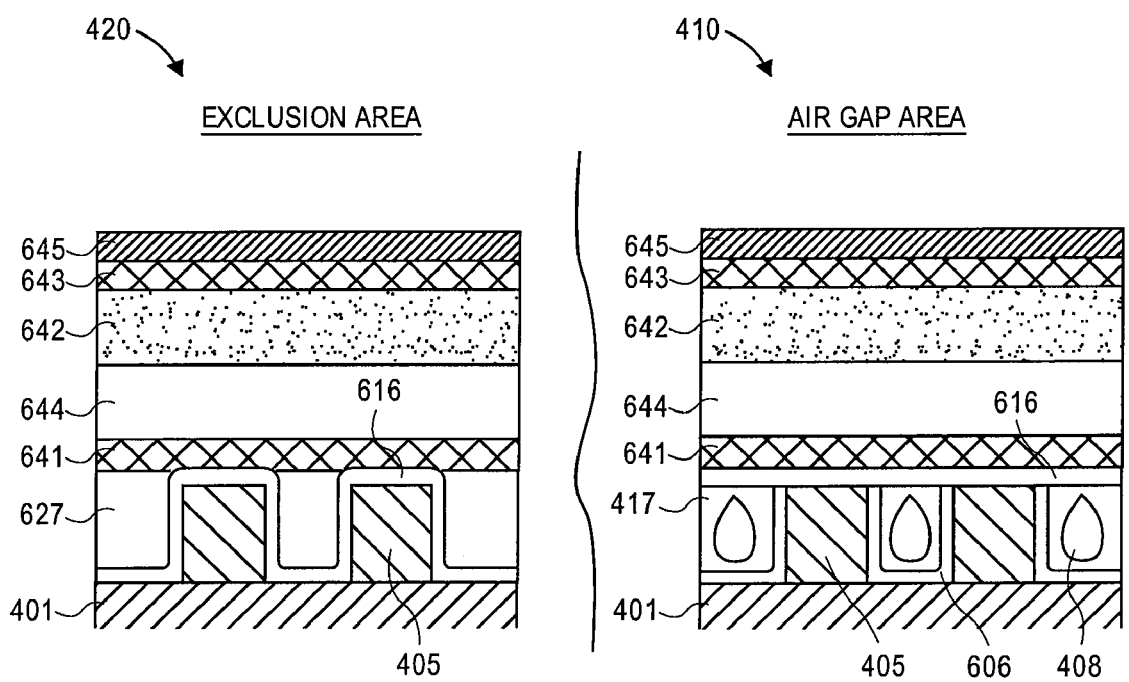

FIG. 6D illustrates embodiments that may further comprise blanket depositing and planarizing a filler dielectric 627 so that the planarized filler dielectric 627 occupies the region between the planarized metal conductor layer 405 in the exclusion area 420. Optionally, embodiments illustrated in FIG. 6E, may comprise preparing for further construction of a second level interconnect by blanket depositing a second level barrier layer 641, a via ILD layer 644, a second carbon-based film 642, a second non-carbon-based layer 643, and a metal hard mask layer 645.

Figure 7:
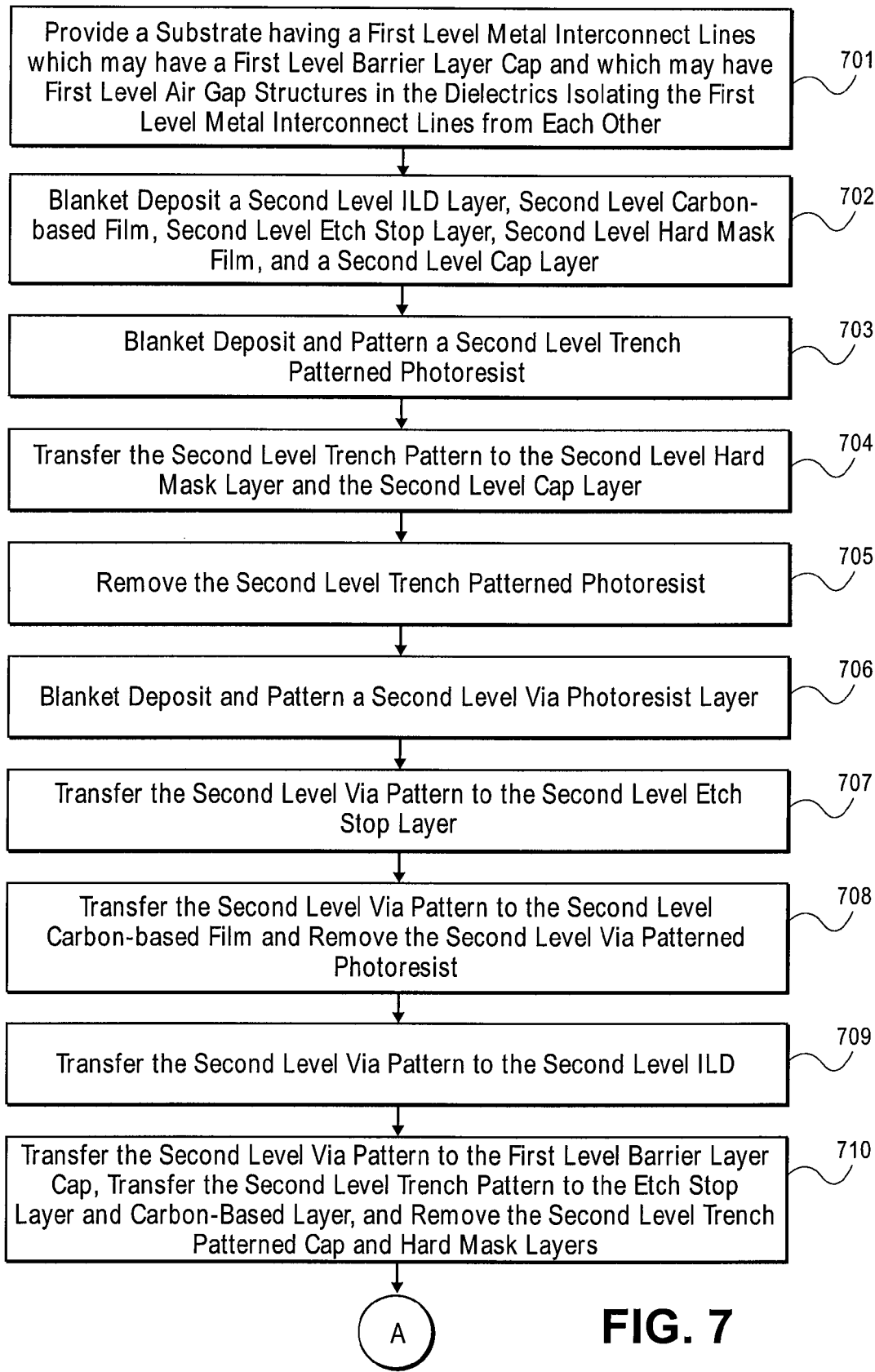
FIG. 7 illustrates a flowchart of embodiments of a method of making, with a metal hard mask, an interconnect structure, which may be a dual damascene second level interconnect having air gaps between the second level interconnect lines.
Figure 7:
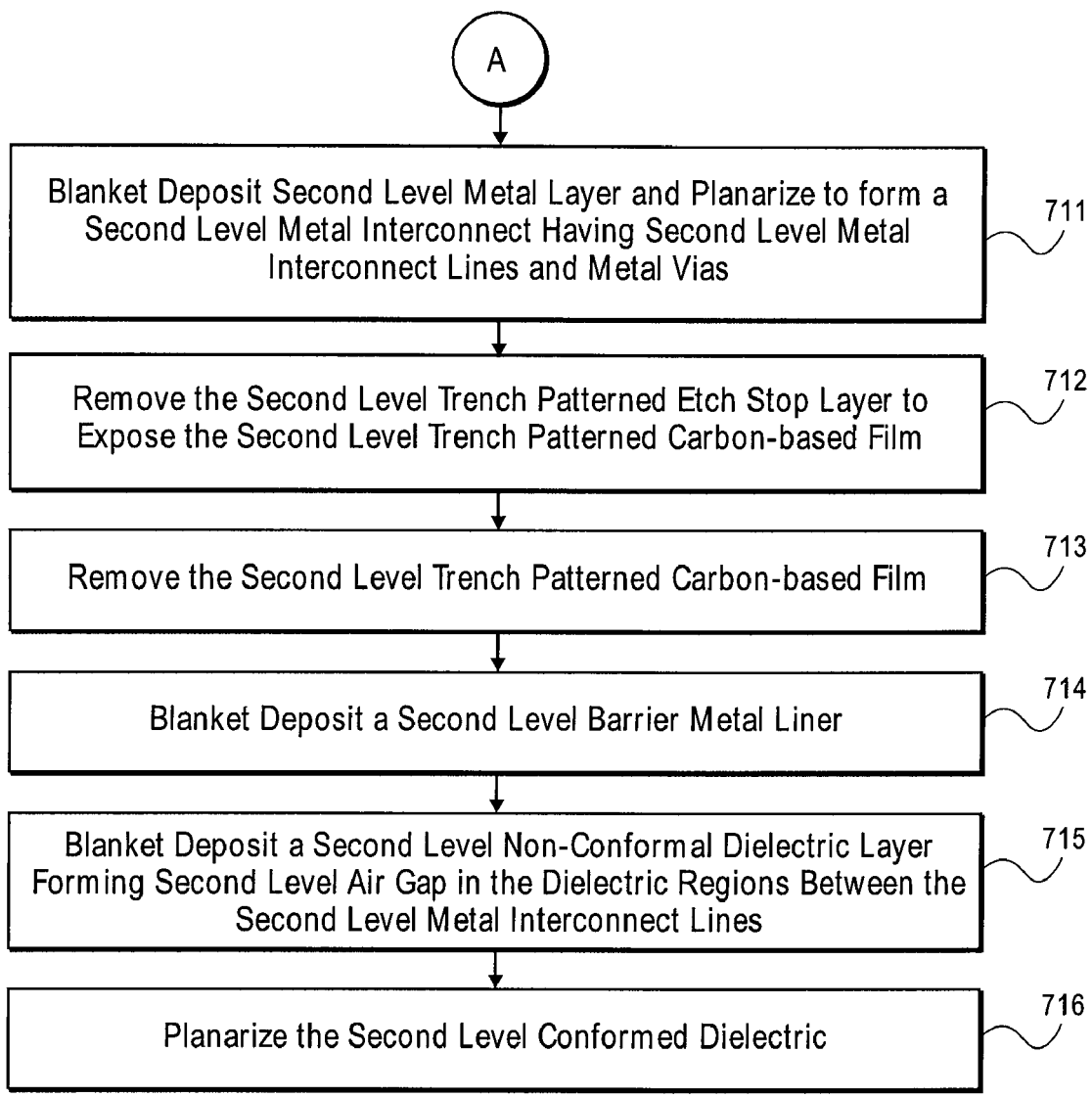

Embodiments, illustrated in FIG. 7, relate to a flowchart of a method of making a dual damascene interconnect structure having a plurality of interconnect lines with air gaps between the interconnect lines, wherein the methods may comprise the use of a metal hard mask, such as TiN. Embodiments of the following methods may further comprise any and all embodiments previously described. Embodiments of methods of making a dual damascene interconnect structure may comprise: providing a substrate having a first level metal interconnect lines which may have a first level barrier layer cap and which may have first level air gap structures in the dielectrics isolating the first level metal interconnect lines from each other, block 701; blanket deposit a second level ILD layer, second level carbon-based film, second level etch stop layer, second level hard mask layer, and a second level cap layer, block 702; blanket depositing and patterning a second level trench patterned photoresist layer, block 703; transferring the second level trench pattern to the second level hard mask layer and the second level cap layer, block 704; removing the second level trench patterned photoresist layer, block 705; blanket depositing and patterning a second level via photoresist layer, block 706; transferring the second level via pattern to the second level etch stop layer, block 707; and transferring the second level via pattern to the second level carbon-based film and removing the second level via patterned photoresist, block 708.

Similar to previously described embodiments, embodiments may comprise the removal of part of the second level carbon-based film and the removal of the second level via patterned photoresist layer, may be performed substantially simultaneously with substantially the same removal process, thus combining two processing operations into a single processing operation.

Embodiments, further illustrated in FIG. 7, related to methods of making a dual damascene interconnect structure may further comprise: transferring the second level via pattern to the second level ILD, block 709; transferring the second level via pattern to the first level barrier layer cap, transferring the second level trench pattern to the etch stop layer and the carbon-based layer, and removing the second level trench patterned cap and hard mask layers, block 710; blanket depositing a second level metal layer and planarizing to form a second level metal interconnect having second level metal interconnect lines and metal vias, block 711; removing the second level trench patterned etch stop layer to expose the second level trench patterned carbon-based film, block 712; removing the second level trench patterned carbon-based film, block 713; and blanket depositing a second level barrier metal liner, block 714.

Similar to previously described embodiments, embodiments may comprise a highly reactive hydrogen radicals process to pre-clean the surface of the interconnect structure for the deposition of the second level barrier metal liner. In embodiments, the removal of the second level trench patterned carbon-based film may comprise a highly reactive hydrogen radicals process to remove the patterned carbon-based film and to pre-clean the surface of the interconnect structure for the deposition of the second level barrier metal liner, thus combining the removal and pre-clean processes into a single process on a single piece of equipment. In embodiments, the highly reactive hydrogen radicals process may comprise an Akiv™ pre-clean (equipment and processes available from Applied Materials, Inc. of Santa Clara, Calif.). In embodiments, the patterned carbon-based film 412 may comprise amorphous carbon and/or an advanced patterning film (APF™) (available from Applied Materials, Inc. of Santa Clara, Calif.).

Embodiments, further illustrated in FIG. 7, related to methods of making a dual damascene interconnect structure that may further comprise: blanket depositing a second level non-conformal dielectric layer forming second level air gap in the dielectric regions between the second level metal interconnect lines, block 715; and planarizing the second level non-conformal dielectric layer, block 716.

FIGS. 8A to 8I illustrate cross sectional views of embodiments of structures processed according to embodiments of a method of making, with a metal hard mask, an interconnect structure, which may be a dual damascene second level interconnect having air gaps between the second level interconnect lines. In embodiments, the metal hard mask may comprise a conductive material selected from the group consisting of titanium nitride, titanium, tungsten, and conductive oxides. Embodiments of the following methods may further comprise part of any and all embodiments previously described in combination with the following embodiments of making a dual damascene interconnect structure.

Figure 8A:
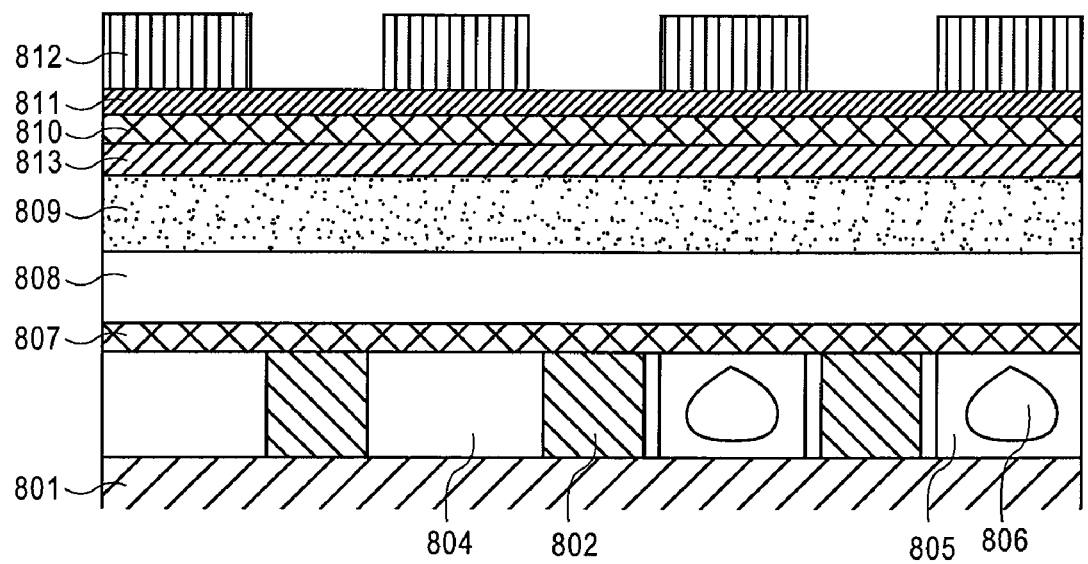
FIGS. 8A to 8I illustrate cross sectional views of embodiments of structures processed according to embodiments of a method of making, with a metal hard mask, an interconnect structure, which may be a dual damascene second level interconnect having air gaps between the second level interconnect lines.

Embodiments, illustrated in FIG. 8A, of methods of making a dual damascene interconnect structure may comprise: providing a substrate 801 having a plurality of first level metal interconnect lines 802, which may have a first level barrier layer cap 807, and which may have a first level air gap 806 in the first level non-conformal dielectric 805 isolating the first level metal interconnect lines 802 from each other, and which may have a first level dielectric 804 isolating the first level metal interconnect lines 802 from each other; blanket depositing a second level ILD layer 808, a second level carbon-based film 809, a second level etch stop layer 813, a second level hard mask layer 810, where in embodiments the second level hard mask 810 may comprise a metal hard mask, wherein the metal hard mask may comprise a conductive material selected from the group consisting of titanium nitride, titanium, tungsten, and conductive oxides; a second level cap layer 811, wherein the cap layer may be an oxide, where in embodiments, the cap layer comprises an oxide of the underlying hard mask layer 810; and blanket depositing and patterning a second level trench patterned photoresist layer 812.

Figure 8B:
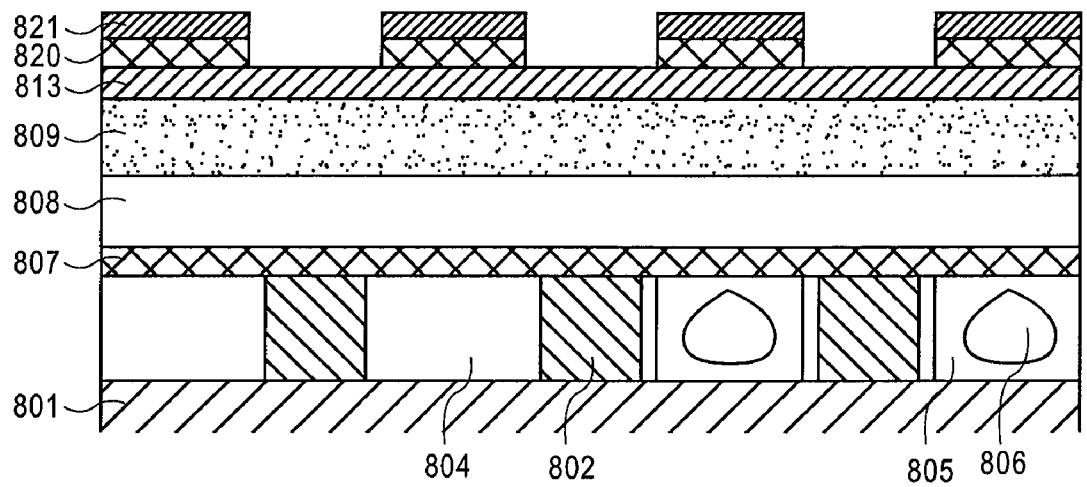
Figure 8C:
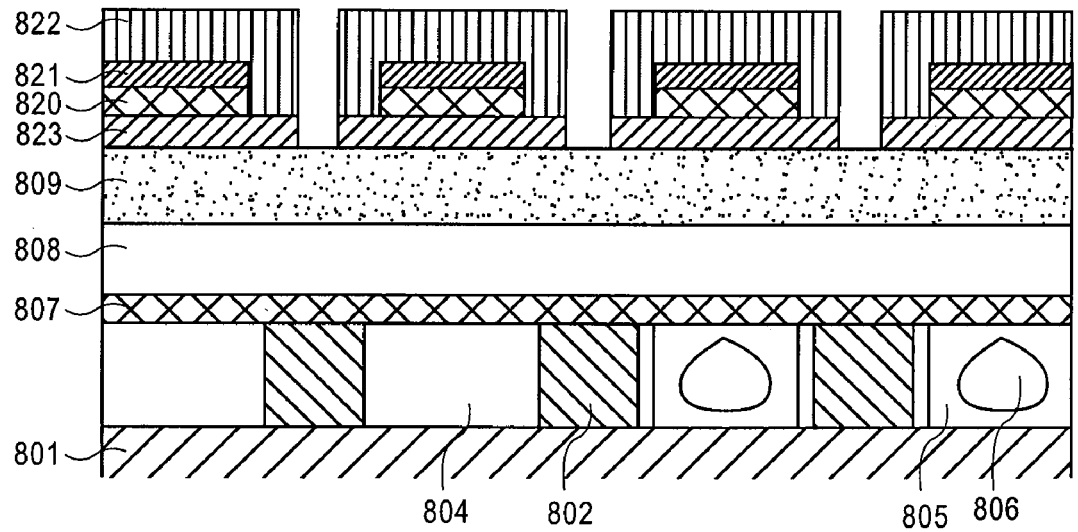

Embodiments, illustrated in FIG. 8B, may further comprise: transferring the second level trench pattern to the second level cap layer 811, 821 and the second level hard mask layer 810, 820; and removing the second level trench patterned photoresist layer 812. Embodiments, illustrated in FIG. 8C, may further comprise: blanket depositing and patterning a second level via photoresist layer 822; and transferring the second level via pattern to the second level etch stop layer 813.

Figure 8D:
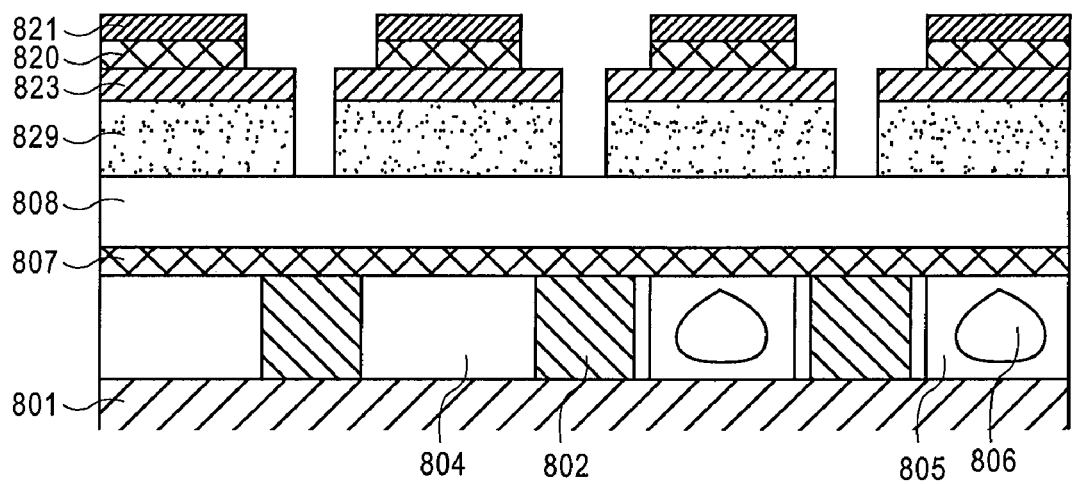

Embodiments, illustrated in FIG. 8D, of methods of making a dual damascene interconnect structure may further comprise transferring the second level via pattern to the second level carbon-based film 809 and removing the second level via patterned photoresist layer 822. Similar to previously described embodiments, embodiments may comprise the removal of part of the second level carbon-based film 809 and the removal of the second level via patterned photoresist layer 822, may be performed substantially simultaneously with substantially the same removal process, thus combining two processing operations into a single processing operation.

Figure 8E:
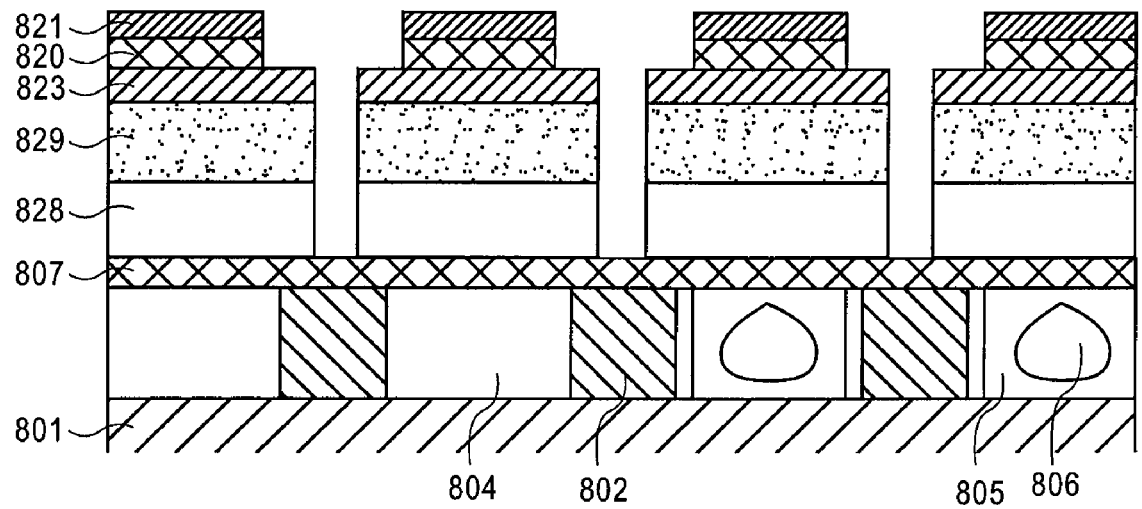
Figure 8F:
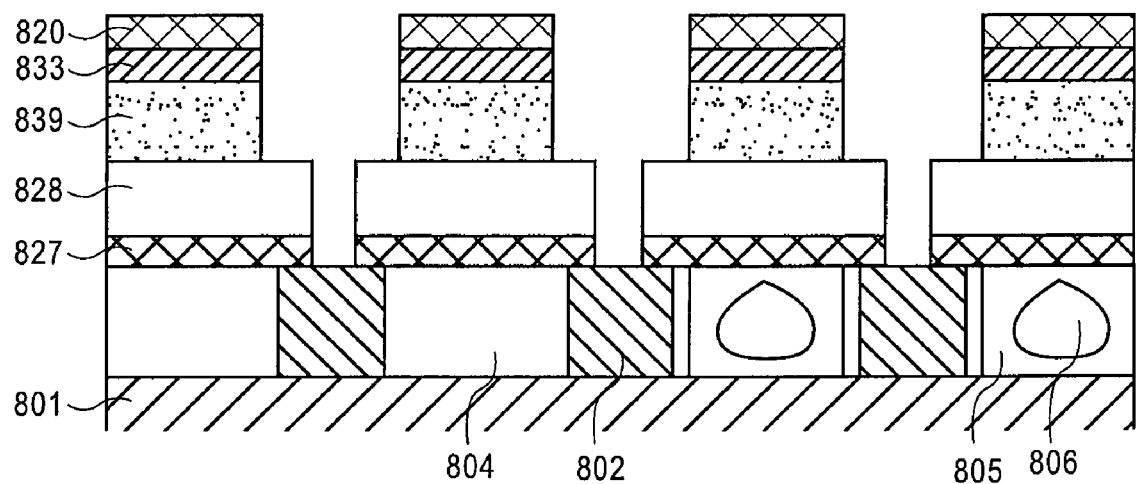

Embodiments, illustrated in FIG. 8E, may further comprise transferring the second level via pattern to the second level ILD layer 808. Embodiments, illustrated in FIG. 8F, may further comprise: transferring the second level via pattern to the first level barrier layer cap 807; transferring the second level trench pattern to the second level via patterned etch stop 823 to form a second level trench patterned etch stop 833; transferring the second level trench pattern to the second level via patterned carbon-based layer 829 to form a second level trench patterned carbon-based layer 839; and removing the second level trench patterned cap layer 821.

Figure 8G:
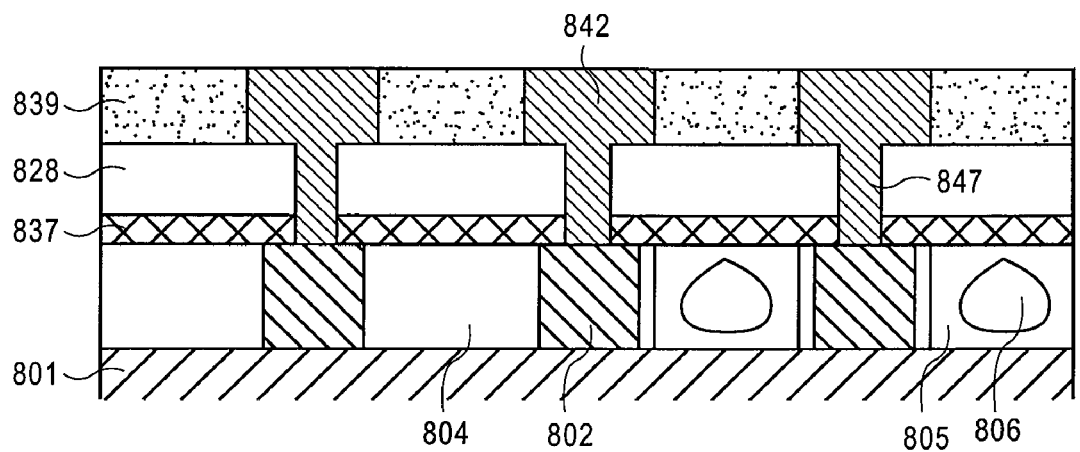

Embodiments, illustrated in FIG. 8G, may further comprise: blanket depositing and planarizing a conductive metal to form a plurality of second level metal interconnect lines 842 and a plurality of metal vias 847; removing the second level trench patterned hard mask layer 820; and removing the second level trench patterned etch stop layer 833 to expose the second level trench patterned carbon-based film 839.

Figure 8H:
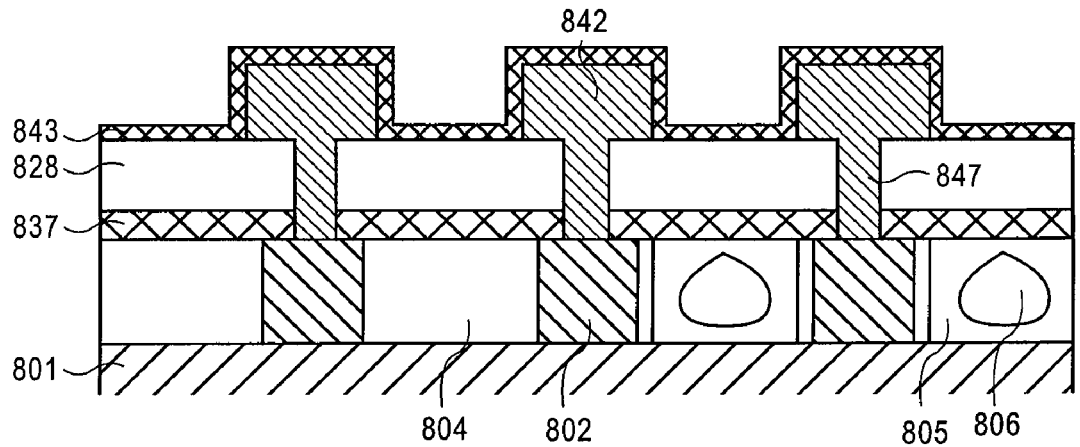
Figure 8I:
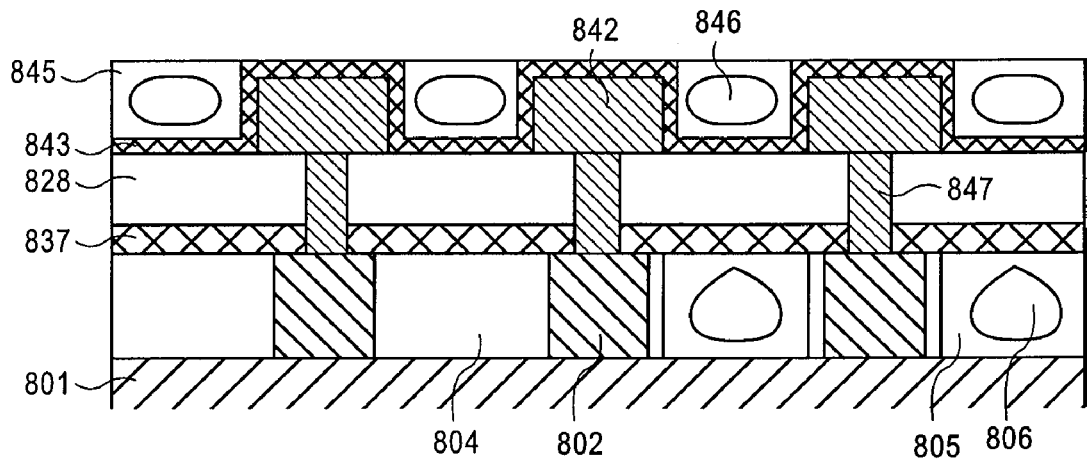

Embodiments, illustrated in FIG. 8H, may further comprise: removing the second level trench patterned carbon-based film 839; and blanket depositing a second level barrier metal liner 843. Similar to previously described embodiments, embodiments may comprise a highly reactive hydrogen radicals process to pre-clean the surface of the interconnect structure for the deposition of second level barrier metal liner 843. In embodiments, the removal of the second level trench patterned carbon-based film 839 may comprise a highly reactive hydrogen radicals process to remove the second level trench patterned carbon-based film 839 and to pre-clean the surface of the interconnect structure for the deposition of a second level barrier metal liner 843, thus combining the removal and pre-clean processes into a single process on a single piece of equipment. In embodiments, the highly reactive hydrogen radicals process may comprise an Akiv™ pre-clean (equipment and processes available from Applied Materials, Inc. of Santa Clara, Calif.). In embodiments, the patterned carbon-based film 412 may comprise amorphous carbon and/or an advanced patterning film (APF™) (available from Applied Materials, Inc. of Santa Clara, Calif.).

Embodiments, illustrated in FIG. 8H, may further comprise blanket depositing and planarizing a second level non-conformal dielectric layer 845 to forming a second level air gap 846 in the planarized non-conformal dielectric layer 845 in the regions between the second level metal interconnect lines 842.

Figure 9:
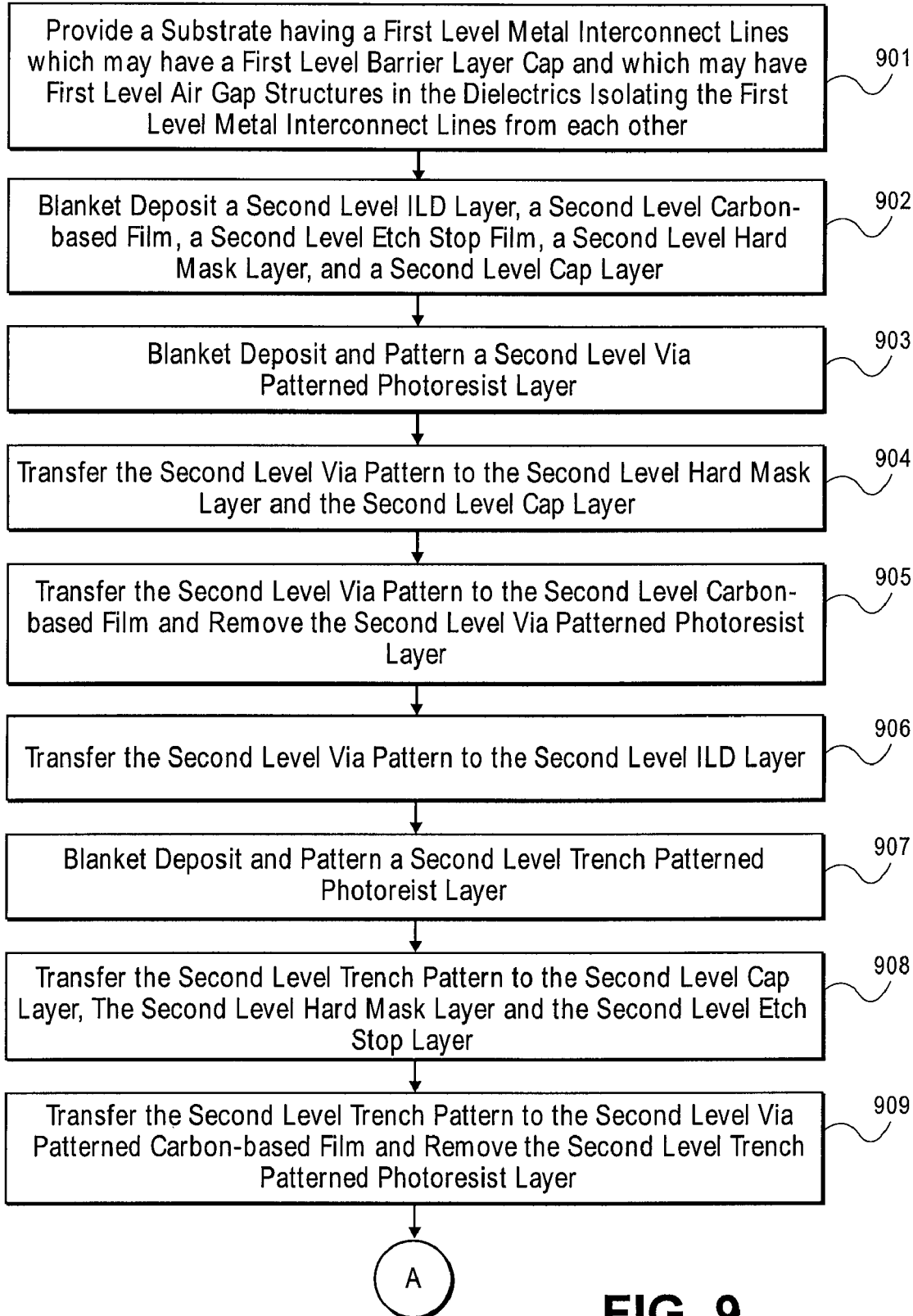
FIG. 9 illustrates a flowchart of embodiments of a method of making, with a via first method using a sacrificial carbon-based film, an interconnect structure, which may be a dual damascene second level interconnect having air gaps between the second level interconnect lines.
Figure 9:
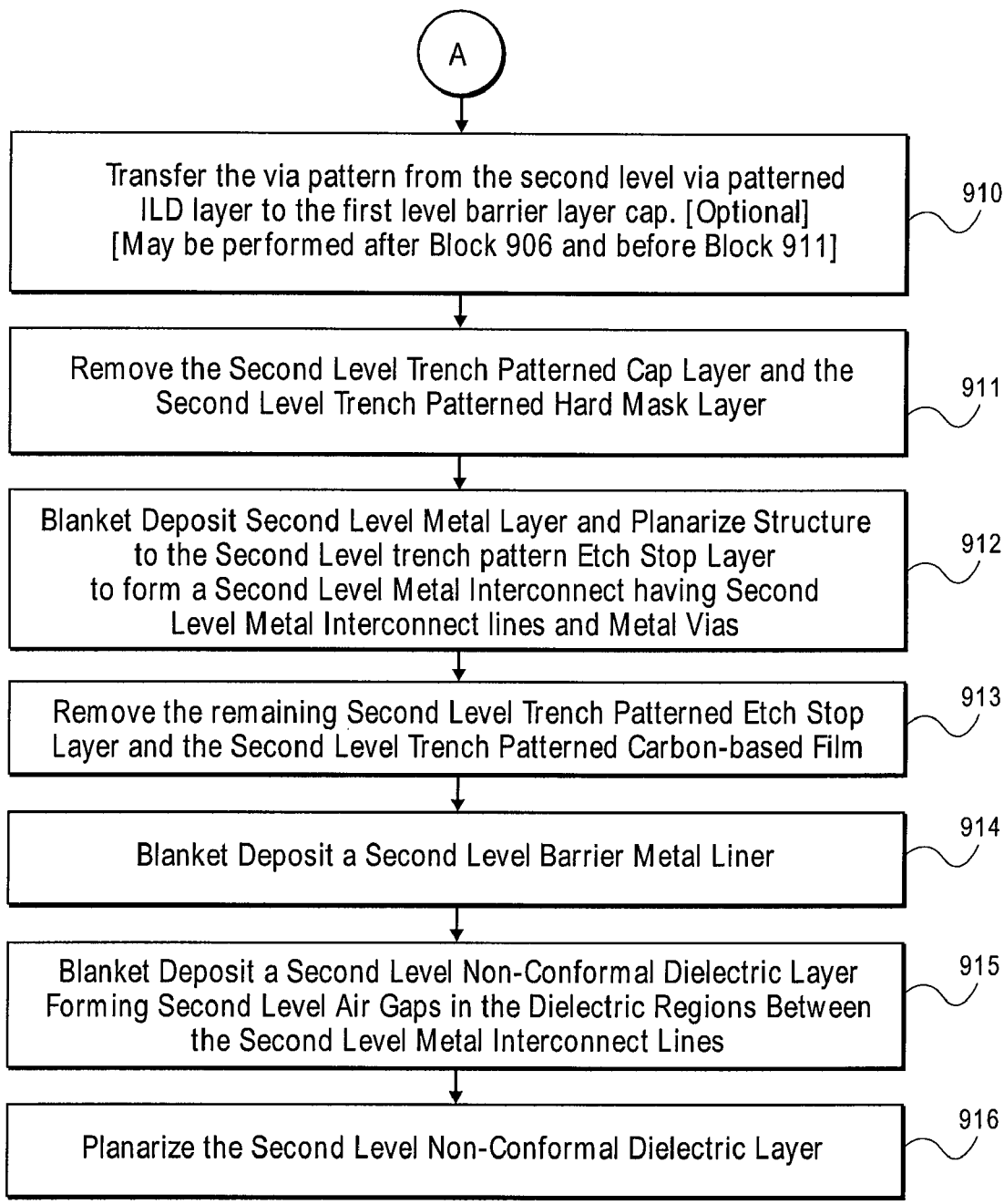

Embodiments, illustrated in FIG. 9, relate to a flowchart of a method of making a dual damascene interconnect structure having a plurality of interconnect lines with air gaps between the interconnect lines, wherein the methods may comprise a via first method with a sacrificial carbon-based layer. Embodiments of the following methods may further comprise any and all embodiments previously described.

Embodiments of methods of making a dual damascene interconnect structure may comprise: providing a substrate having a first level metal interconnect lines which may have a first level barrier layer cap and which may have first level air gap structures in the dielectrics isolating the first level metal interconnect lines from each other, block 901; blanket depositing a second level ILD layer, a second level carbon-based film, a second level etch stop layer, a second level hard mask layer, and a second level cap layer, block 902; blanket depositing and patterning a second level via patterned photoresist layer, block 903; transferring the second level via pattern to the second level cap layer and the second level hard mask layer, block 904; and transferring the second level via pattern to the second level carbon-based film and removing the second level via patterned photoresist layer, block 905.

Similar to previously described embodiments, embodiments may comprise the removal of part of the second level carbon-based film and the removal of the second level via patterned photoresist layer, may be performed substantially simultaneously with substantially the same removal process, thus combining two processing operations into a single processing operation.

Embodiments, further illustrated in FIG. 9, relate to methods of making a dual damascene interconnect structure may further comprise: transferring the second level via pattern to the second level ILD layer, block 906; blanket depositing and patterning a second level trench patterned photoreist layer, block 907; transferring the second level trench pattern to the second level hard mask layer and the second level non-carbon-based film, block 908; and transferring the second level trench pattern to the second level via patterned carbon-based film and removing the second level trench patterned photoresist layer, block 909. Similar to previously described embodiments, embodiments may comprise the removal of part of the second level via patterned carbon-based film and the removal of the second level trench patterned photoresist layer, may be performed substantially simultaneously with substantially the same removal process, thus combining two processing operations into a single processing operation.

Embodiments, further illustrated in FIG. 9, may further comprise transferring the via pattern from the second level via patterned ILD layer to the first level barrier layer cap, block 910, which is optional, and may be performed after block 906 and before block 911. Embodiments, further illustrated in FIG. 9, relate to methods of making a dual damascene interconnect structure may further comprise: removing the second level trench patterned cap layer and the second level trench patterned hard mask layer, block 911; blanket depositing a second level metal layer and planarizing the structure down to the second level trench patterned etch stop layer to form a second level metal interconnect having second level metal interconnect lines and metal vias, block 912; removing the remaining second level trench patterned etch stop layer and the second level trench patterned carbon-based film, block 913; and blanket depositing a second level barrier metal liner, block 914.

Similar to previously described embodiments, embodiments may comprise a highly reactive hydrogen radicals process to pre-clean the surface of the interconnect structure for the deposition of the second level barrier metal liner. In embodiments, the removal of the second level trench patterned carbon-based film may comprise a highly reactive hydrogen radicals process to remove the patterned carbon-based film and to pre-clean the surface of the interconnect structure for the deposition of the second level barrier metal liner, thus combining the removal and pre-clean processes into a single process on a single piece of equipment.

Embodiments, further illustrated in FIG. 9, may further comprise: blanket depositing a second level non-conformal dielectric layer, forming second level air gaps in the dielectric regions between the second level metal interconnect lines, block 915; and planarizing the second level non-conformal dielectric layer, block 916.

FIGS. 10A to 10I illustrate cross sectional views of embodiments of structures processed according to embodiments of a method of making, with a via first method using a sacrificial carbon-based film, an interconnect structure, which may be a dual damascene second level interconnect having air gaps between the second level interconnect lines. Embodiments of the following methods may further comprise any and all embodiments previously described.

Figure 10A:
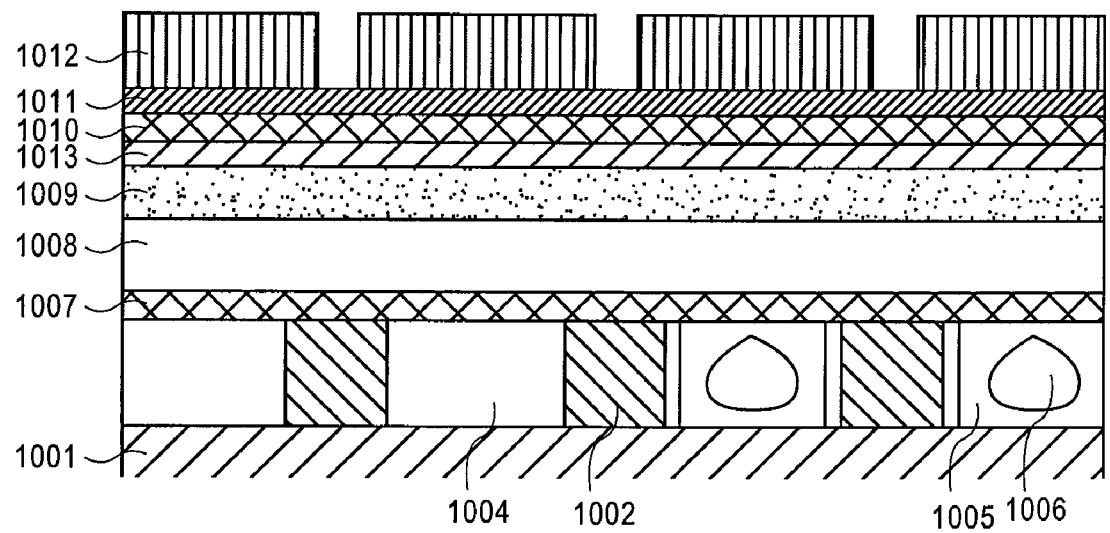
FIGS. 10A to 10I illustrate cross sectional views of embodiments of structures processed according to embodiments of a method of making, with a via first method using a sacrificial carbon-based film, an interconnect structure, which may be a dual damascene second level interconnect having air gaps between the second level interconnect lines.

Embodiments, illustrated in FIG. 10A, may comprise: providing a substrate 1001 having a plurality first level metal interconnect lines 1002, which may have a first level barrier layer cap 1007, and which may have a first level air gap 1006 in first level non-conformal dielectric 1005 isolating the first level metal interconnect lines 1002 from each other, and which may have a first level dielectric 1004 isolating the first level metal interconnect lines 1002 from each other; blanket depositing a second level ILD layer 1008, a second level carbon-based film 1009, a second level etch stop layer 1013, and a second level hard mask layer 1010, and a second level cap layer 1011; blanket depositing and patterning a second level via patterned photoresist layer 1012.

Figure 10B:
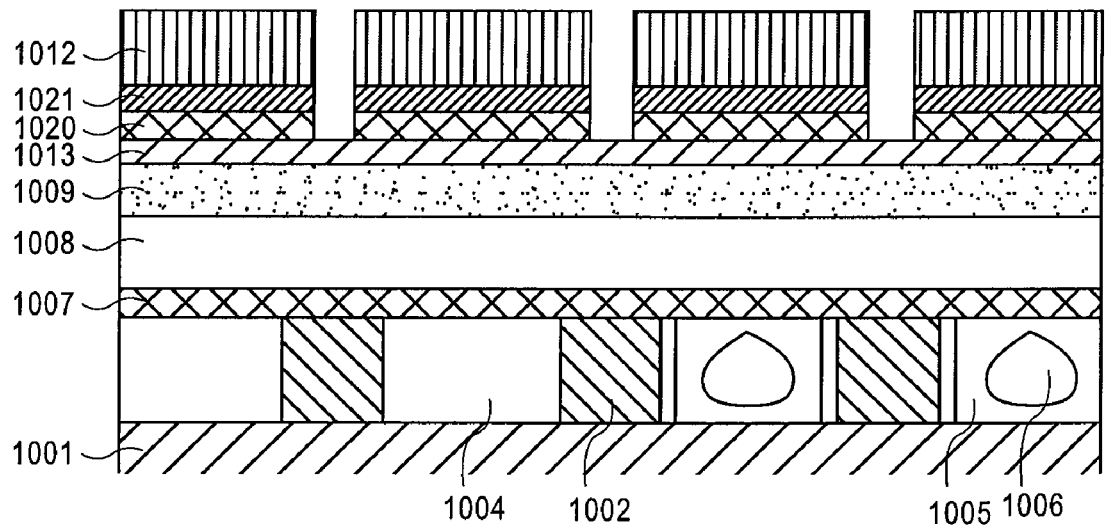

Embodiments, illustrated in FIG. 10B, may further comprise transferring the second level via pattern to the second level cap layer 1011, 1021 and the second level hard mask layer 1010, 1020. Embodiments, illustrated in FIG. 10C, may further comprise: transferring the second level via pattern to the etch stop layer 1013, 1023, and the second level carbon-based film 1009, 1029; removing the second level via patterned photoresist layer 1012; and transferring the second level via pattern to the second level ILD layer 1008, 1028.

Figure 10C:
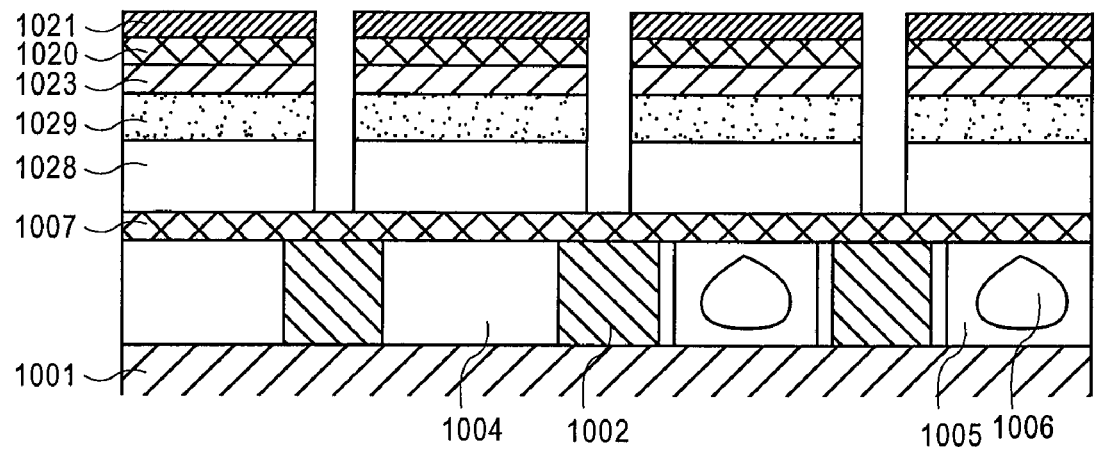

Similar to previously described embodiments, embodiments may comprise the removal of part of the second level carbon-based film 1009 and the removal of the second level via patterned photoresist layer 1012, may be performed substantially simultaneously with substantially the same removal process, thus combining two processing operations into a single processing operation. In embodiments, the via pattern may be transferred into the first level barrier layer cap 1007 after the formation of the second level via patterned ILD layer 1028, as illustrated in FIG. 10C, and before the metallization process as illustrated in FIG. 10F to form a first level via patterned barrier layer cap 1037.

Figure 10D:
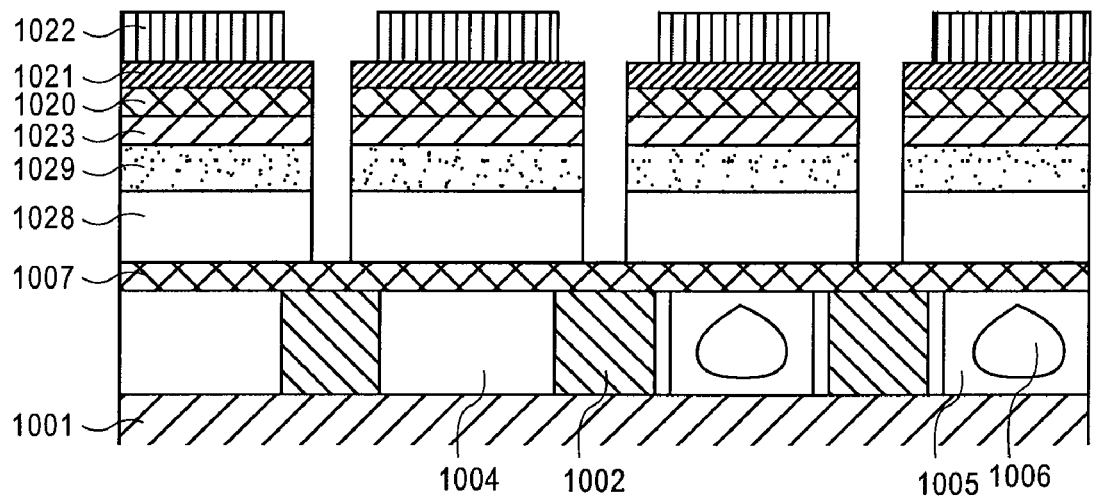
Figure 10E:
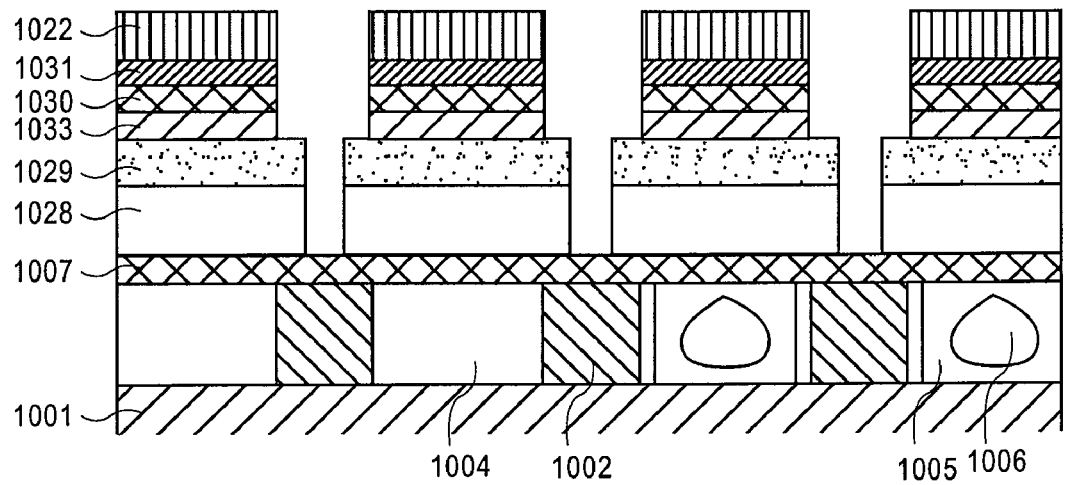
Figure 10F:
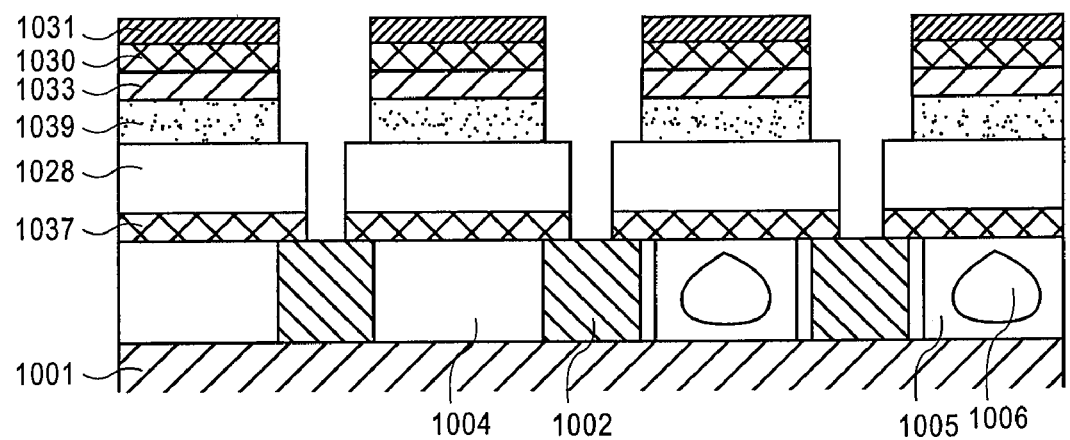

Embodiments, illustrated in FIG. 10D, may further comprise blanket depositing and patterning a second level trench patterned photoreist layer 1022. Embodiments, illustrated in FIG. 10E, may further comprise transferring the second level trench pattern to the second level cap layer 1021, 1031, the second level via patterned hard mask layer 1020, 1030, and the second level via patterned etch stop layer 1023, 1033. Embodiments, illustrated in FIG. 10F, may further comprise: transferring the second level trench pattern to the second level via patterned carbon-based film 1029, 1039; removing the second level trench patterned photoresist layer 1022; transferring the via pattern from the second level via patterned ILD layer 1028 to the first level barrier layer cap 1007, to form a first level via patterned barrier layer cap 1037; and removing all or part of the second level trench patterned cap and hard mask layers, 1031 and 1030, respectively.

Similar to previously described embodiments, embodiments may comprise the removal of part of the second level via patterned carbon-based film 1029 and the removal of the second level trench patterned photoresist layer 1022, may be performed substantially simultaneously with substantially the same removal process, thus combining two processing operations into a single processing operation. In embodiments, similar to previously described embodiments, embodiments may comprise a highly reactive hydrogen radicals process to pre-clean the surface of the first level metal interconnect lines 1002, which may have been exposed with the transfer of the via pattern to the first level barrier layer cap 1007, to form a first level via patterned barrier layer cap 1037. In embodiments, the removal of part of the second level via patterned carbon-based film 1029 may comprise a highly reactive hydrogen radicals process to remove the patterned carbon-based film and to pre-clean the surface of the first level metal interconnect lines exposed with the via pattern in preparation for the deposition of a metal layer to form a metal via 1047, illustrated in FIG. 10G, thus combining the removal and pre-clean processes into a single process on a single piece of equipment. In embodiments, the pre-clean processes prior to the deposition of the metal layer may comprise a wet clean. In embodiments, a pre-clean may comprise a dilute HF dip to follow an etch, so as to remove any etch residues.

Figure 10G:
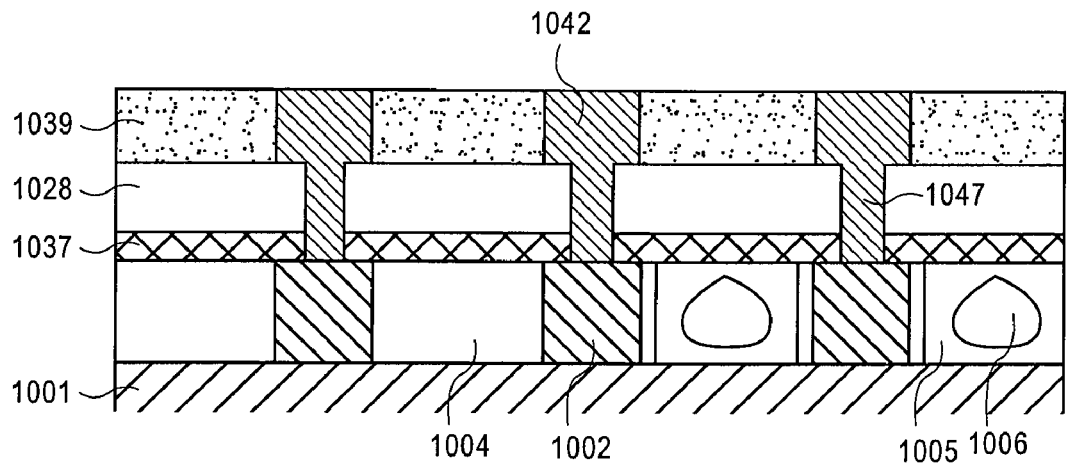

Embodiments, illustrated in FIG. 10G, may further comprise: blanket depositing a metal layer and planarizing to form a plurality of second level metal interconnect lines 1042 with a plurality of metal vias 1047; and removing any remaining portion of the second level trench patterned cap and hard mask layers 1031, 1030 and the second level trench patterned etch stop layer 1033.

Figure 10H:
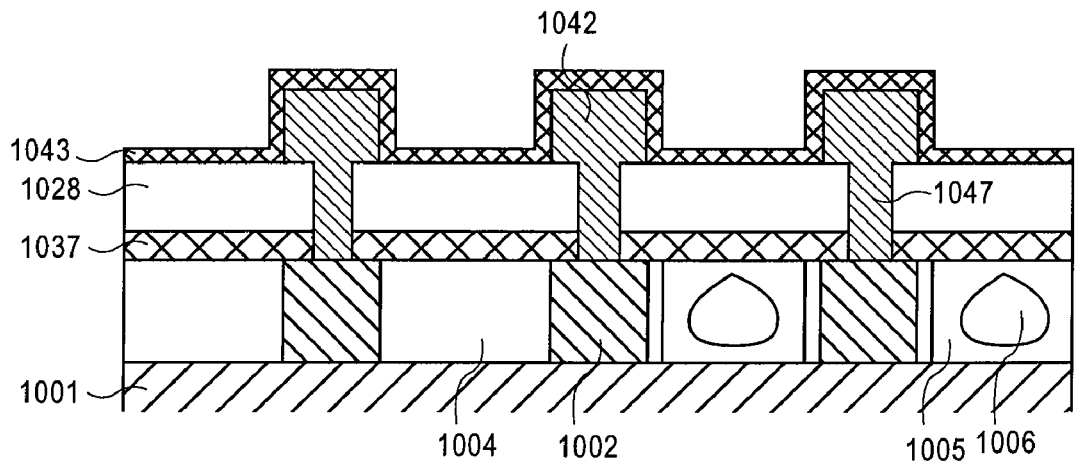
Figure 10I:
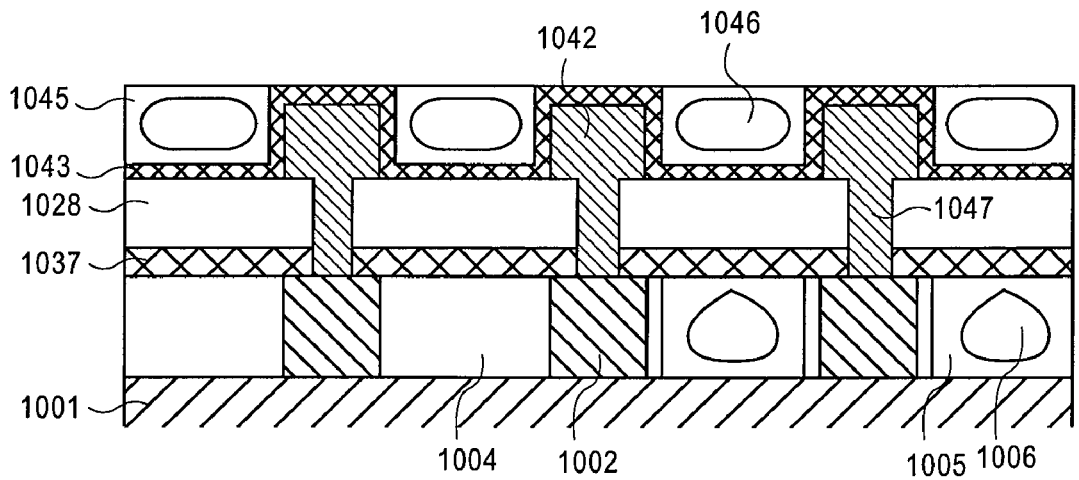

Embodiments, illustrated in FIG. 10H, may further comprise: removing the second level trench patterned carbon-based film 1039; and blanket depositing a second level barrier metal liner 1043. Similar to previously described embodiments, embodiments may comprise a highly reactive hydrogen radicals process to pre-clean the surface of the interconnect structure for the deposition of the second level barrier metal liner 1043. In embodiments, the removal of the second level trench patterned carbon-based film 1039 may comprise a highly reactive hydrogen radicals process to remove the patterned carbon-based film 1039 and to pre-clean the surface of the interconnect structure for the deposition of the second level barrier metal liner 1043, thus combining the removal and pre-clean processes into a single process on a single piece of equipment.

Embodiments, illustrated in FIG. 101, may further comprise blanket depositing and planarizing a second level non-conformal dielectric layer 1045, whereby forming second level air gaps 1046 in the dielectric regions between the second level metal interconnect lines 1042. In embodiments, the patterning of the first level patterned barrier layer cap 1037 may occur after the patterning of the second level via patterned ILD layer 1028 and before the blanket deposition and planarization of the second level metal interconnect lines 1042.

Figure 11:
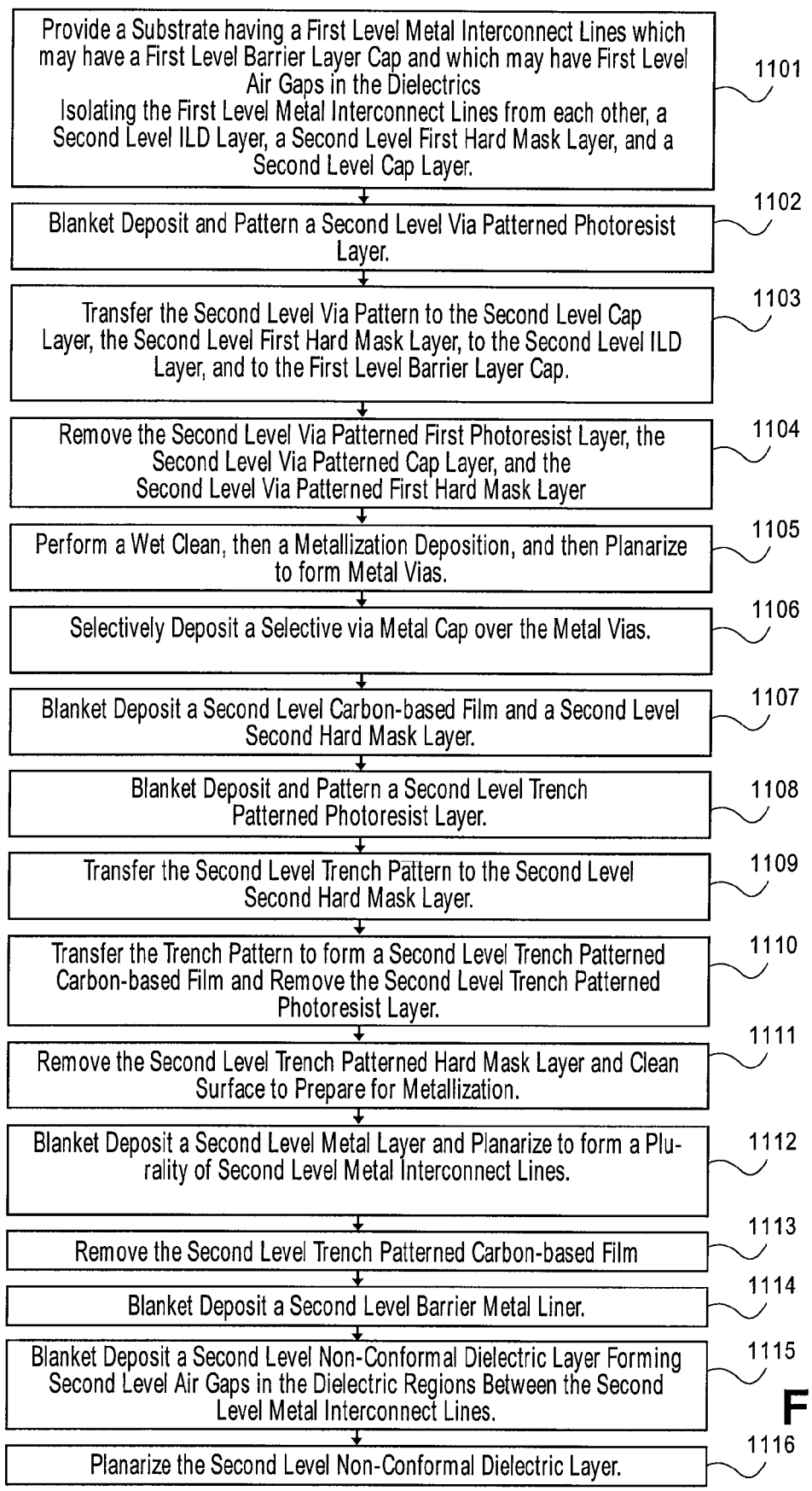
FIG. 11 illustrates a flowchart of embodiments of a method of making, with a sacrificial carbon-based film method, an interconnect structure, which may be a single damascene second level interconnect having air gaps between the second level interconnect lines.

Embodiments, illustrated in FIG. 11, relate to a flowchart of a method of making a single damascene interconnect structure having a plurality of interconnect lines with air gaps between the interconnect lines, wherein the methods may comprise a method with a sacrificial carbon-based film. Embodiments of the following methods may further comprise any and all embodiments previously described.

Embodiments of methods of making a single damascene interconnect structure may comprise: providing a substrate having a plurality of first level metal interconnect lines which may have a first level barrier layer cap and which may have first level air gaps in the dielectrics isolating the first level metal interconnect lines from each other, a second level ILD layer, a second level first hard mask layer layer, which may optionally be omitted in embodiments, and a second level cap layer, which may optionally be omitted in embodiments, block 1101; blanket depositing and patterning a second level via patterned photoresist layer, block 1102; transferring the second level via pattern to the second level cap layer, the second level first hard mask layer, the second level ILD layer, and the first level barrier layer cap, block 1103; removing the second level via patterned photoresist layer, the second level via patterned cap layer, the second level via patterned first hard mask layer, block 1104; performing a wet clean, then a metallization deposition, and then planarizing to form metal vias, block 1105; selectively deposit a selective via metal cap over the metal vias, block 1106; blanket depositing a second level carbon-based film and a second level second hard mask layer, block 1107; blanket depositing and patterning a second level trench patterned photoresist layer, block 1108; transferring the second level trench pattern to the second level hard mask layer, block 1109; and transferring the trench pattern to form a second level trench patterned carbon-based film and removing the second level trench patterned photoresist layer, block 1110.

Similar to previously described embodiments, embodiments may comprise the removal of part of the second level carbon-based film and the removal of the second level trench patterned photoresist layer, may be performed substantially simultaneously with substantially the same removal process, thus combining two processing operations into a single processing operation.

Embodiments, further illustrated in FIG. 11, may further comprise: removing the second level trench patterned hard mask layer and cleaning the surface to prepare for metallization, block 1111; blanket depositing a second level metal layer and planarizing to form a plurality of second level metal interconnect lines, block 1112; removing the second level trench patterned carbon-based film, block 1113; blanket depositing a second level barrier metal liner, block 1114. Similar to previously described embodiments, embodiments may comprise a highly reactive hydrogen radicals process to pre-clean the surface of the interconnect structure for the deposition of the second level barrier metal liner. In embodiments, the removal of the second level trench patterned carbon-based film may comprise a highly reactive hydrogen radicals process to remove the patterned carbon-based film and to pre-clean the surface of the interconnect structure for the deposition of the second level barrier metal liner, thus combining the removal and pre-clean processes into a single process on a single piece of equipment.

Embodiments, further illustrated in FIG. 11, may further comprise: blanket depositing a second level non-conformal dielectric layer forming second level air gaps in the dielectric regions between the second level metal interconnect lines, block 1115; and planarizing the second level non-conformal dielectric layer, block 1116.

FIGS. 12A to 12H illustrate cross sectional views of embodiments of structures processed according to embodiments of a method of making, with a sacrificial carbon-based film method, an interconnect structure, which may be a single damascene second level interconnect having air gaps between the second level interconnect lines. Embodiments of the following methods may further comprise any and all embodiments previously described.

Figure 12A:
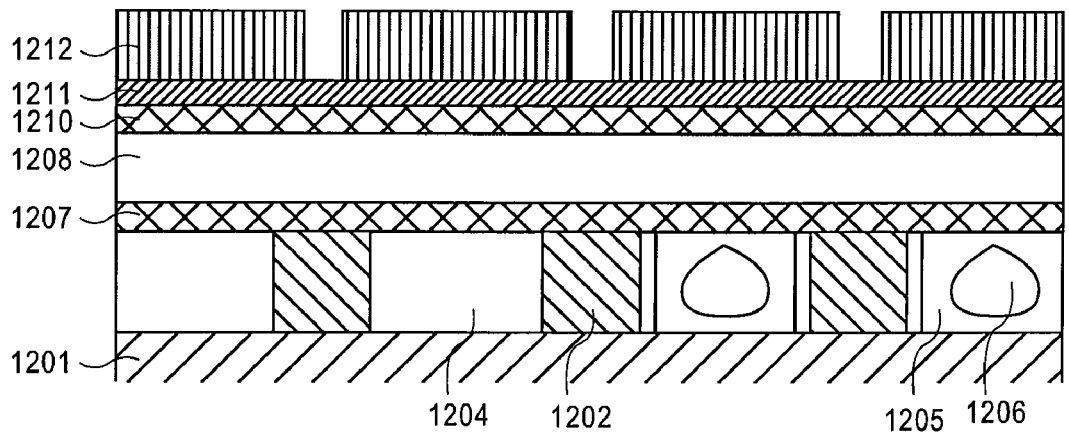
FIGS. 12A to 12H illustrate cross sectional views of embodiments of structures processed according to embodiments of a method of making, with a sacrificial carbon-based film method, an interconnect structure, which may be a single damascene second level interconnect having air gaps between the second level interconnect lines.

Embodiments, illustrated in FIG. 12A, may comprise: providing a substrate 1201 having a plurality of first level metal interconnect lines 1202, which may have a first level barrier layer cap 1207, and which may have first level air gaps 1206 in the first level non-conformal dielectric 1205 isolating the first level metal interconnect lines 1202 from each other, a second level ILD layer 1208, a second level first hard mask layer 1210, which may optionally be omitted in embodiments, and a second level cap layer 1211, which may also optionally be omitted in embodiments; and blanket depositing and patterning a second level via patterned photoresist layer 1212.

Figure 12B:
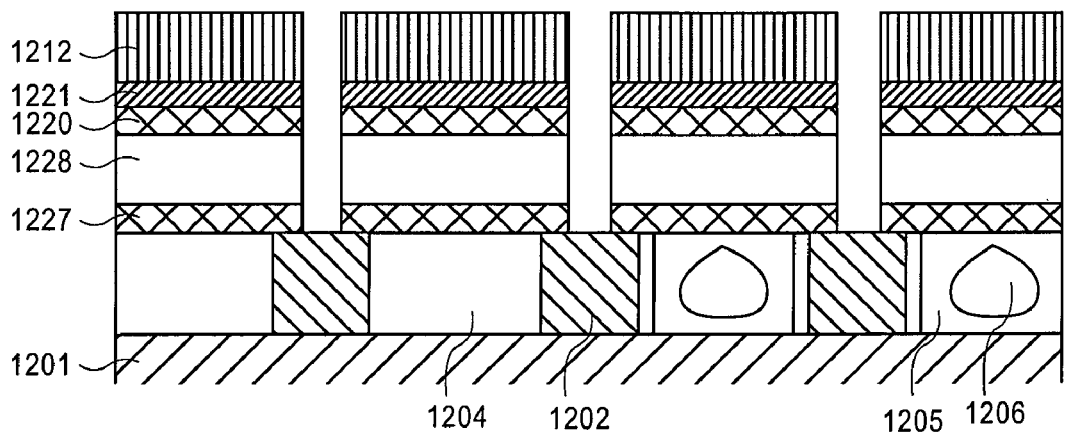
Figure 12C:
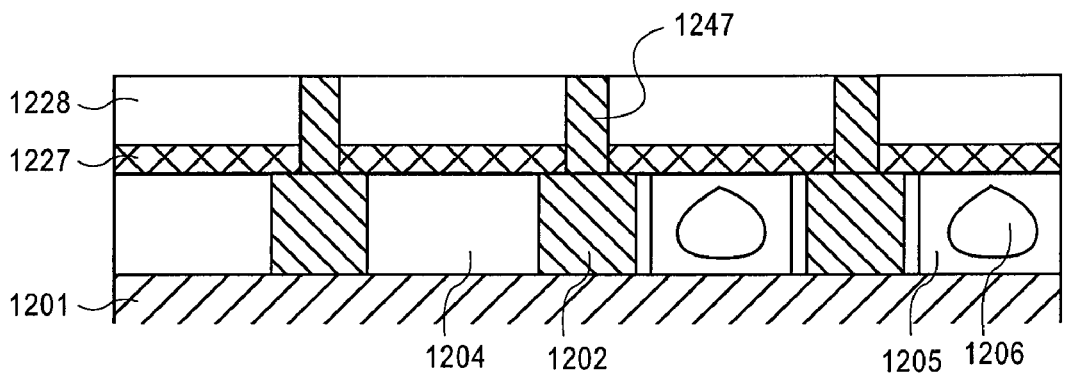

Embodiments, illustrated in FIG. 12B, may comprise transferring the second level via pattern to the second level cap layer 1211, 1221, the second level first hard mask layer 1210, 1220, the second level ILD layer 1208, 1228, and to the first level barrier layer cap 1207, 1227. In embodiments, all or part of the second level via patterned photoresist layer 1212 may be removed while patterning the second level ILD layer 1208, 1228, and/or the first level barrier layer cap 1207, 1227. Embodiments, illustrated in FIG. 12C, may comprise removing the second level via patterned photoresist layer 1212, the second level via patterned cap layer 1221, the second level via patterned first hard mask layer 1220; and performing a wet clean, a blanket metallization deposition, and planarization to form a plurality of metal vias 1247.

Figure 12D:
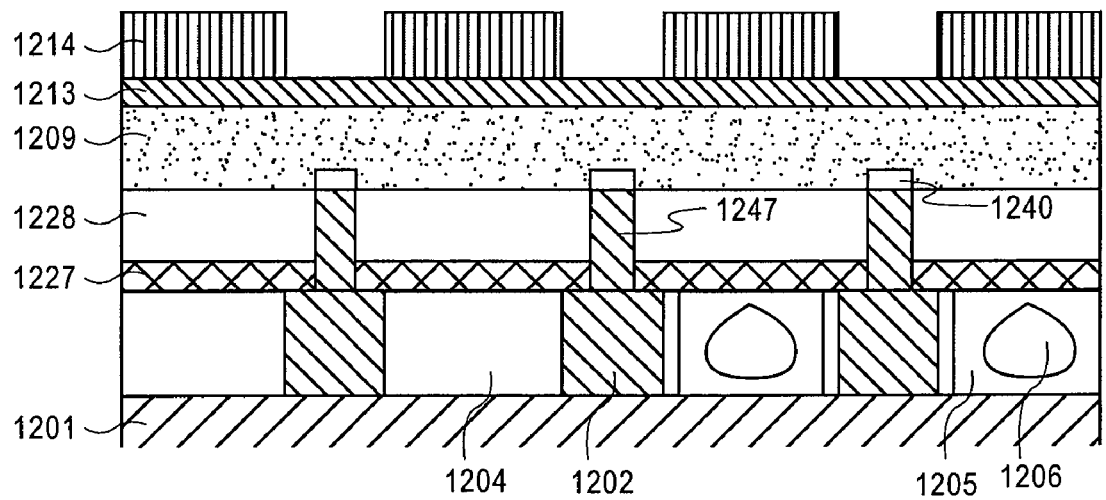

Embodiments, illustrated in FIG. 12D, may comprise: selectively depositing a selective via metal cap 1240 over the metal vias 1247; blanket depositing a second level carbon-based film 1209 and a second level second hard mask layer 1213; and blanket depositing and patterning a second level trench patterned photoresist layer 1214.

Figure 12E:
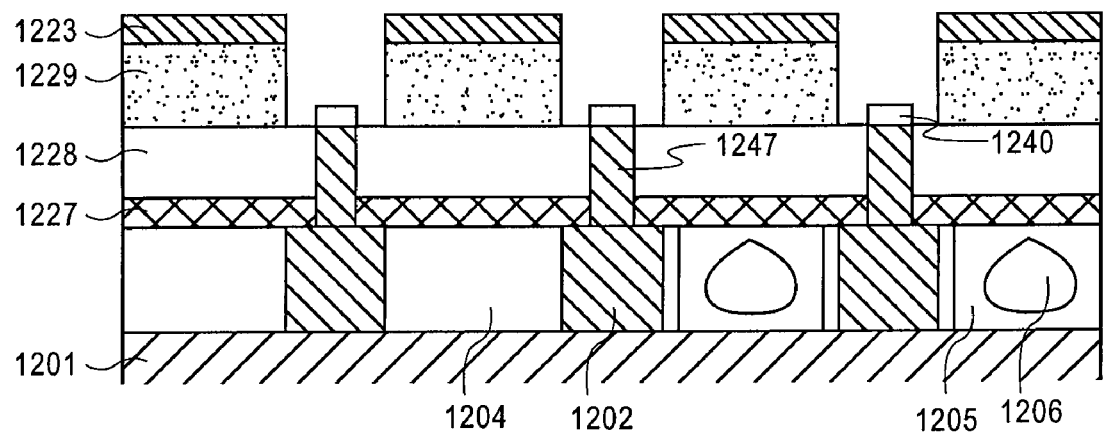

Embodiments, illustrated in FIG. 12E, may comprise: transferring the second level trench pattern to the second level second hard mask layer 1213, 1223; transferring the trench pattern onto the second level carbon-based film 1209 to form a second level trench patterned carbon-based film 1229; and removing the second level trench patterned photoresist layer 1214. Similar to previously described embodiments, embodiments may comprise the removal of part of the second level carbon-based film 1209 and the removal of the second level trench patterned photoresist layer 1214, may be performed substantially simultaneously with substantially the same removal process, thus combining two processing operations into a single processing operation.

Figure 12F:
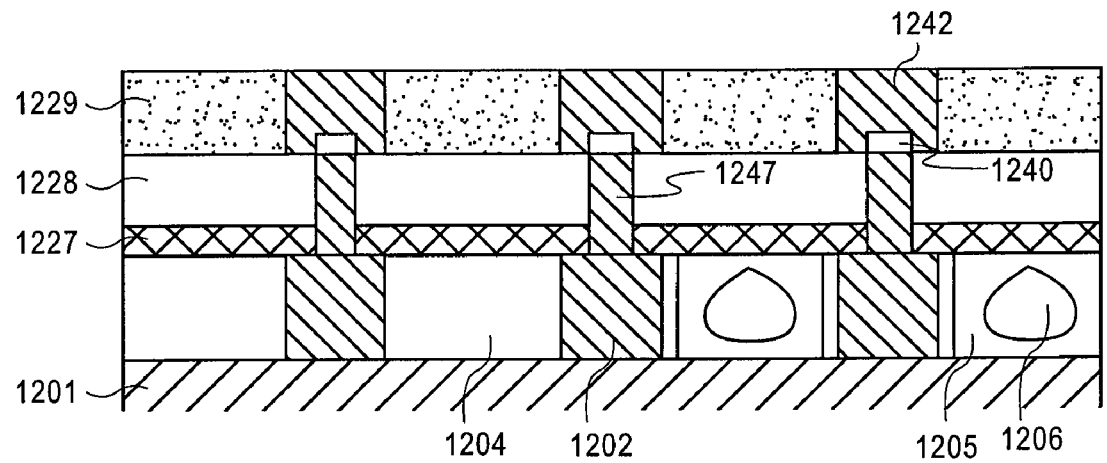
Figure 12G:
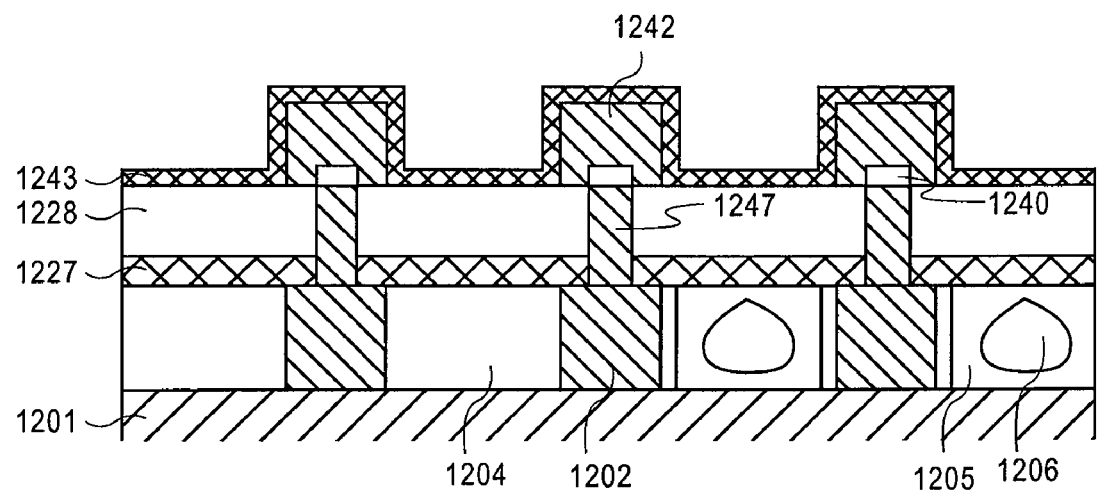

Embodiments, illustrated in FIG. 12F, may comprise: removing the second level trench patterned hard mask layer 1223; cleaning the surface of the interconnect structure to prepare for metallization; and blanket depositing and planarizing a metal layer to form a plurality of second level metal interconnect lines 1242. Embodiments, illustrated in FIG. 12G, may comprise: removing the second level trench patterned carbon-based film 1229; and blanket depositing a second level barrier metal liner 1243. Similar to previously described embodiments, embodiments may comprise a highly reactive hydrogen radicals process to pre-clean the surface of the plurality of second level metal interconnect lines 1242 for the deposition of the second level barrier metal liner 1243. In embodiments, the removal of the second level trench patterned carbon-based film 1229 may comprise a highly reactive hydrogen radicals process to remove the patterned carbon-based film 1229 and to pre-clean the surface of the interconnect structure for the deposition of the second level barrier metal liner 1243, thus combining the removal and pre-clean processes into a single process on a single piece of equipment.

Figure 12H:
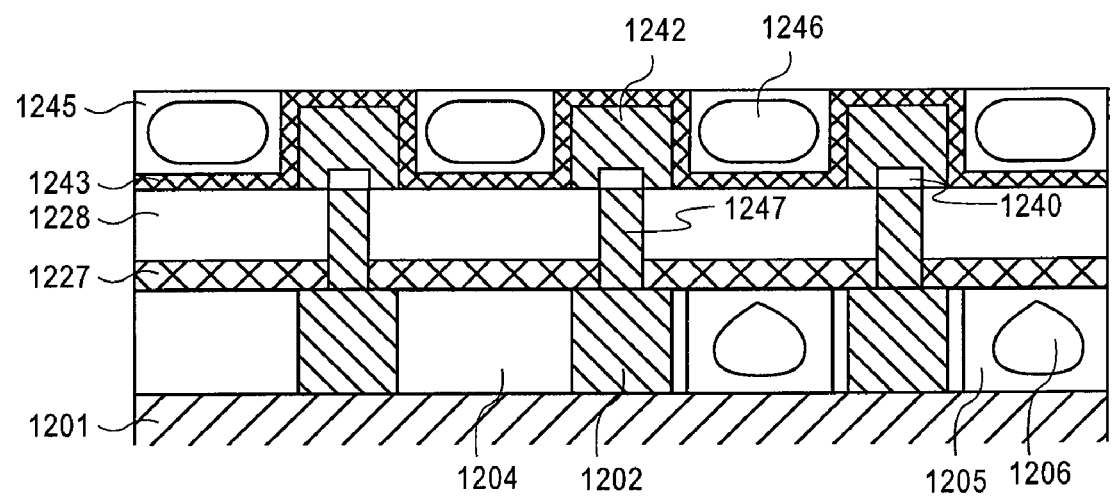

Embodiments, illustrated in FIG. 12H, may comprise: blanket depositing and planarizing a second level non-conformal dielectric layer 1245 forming second level air gaps 1246 in the dielectric regions between the second level metal interconnect lines 1242.

The invention may be practiced using other semiconductor wafer processing systems wherein the processing parameters may be adjusted to achieve acceptable characteristics by those skilled in the arts by utilizing the teachings disclosed herein without departing from the spirit of the invention. Although the forgoing discussion referred to fabrication of interconnect structures, such as single and dual damascene, fabrication of other semiconductor devices and micro-electromechanical devices can benefit from the invention.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. While the foregoing is directed to the illustrative embodiments of the present invention, other and further embodiments of the invention may be devised without departing from the basic scope thereof, as determined by the claims that follow.

I claim:

1. A method of forming an interconnect structure comprising:
    forming a sacrificial inter-metal dielectric (IMD) layer over a substrate, wherein the sacrificial IMD layer comprising a carbon-based film;
    forming a plurality of metal interconnect lines within the sacrificial IMD layer;
    removing the sacrificial IMD layer; and
    depositing a non-conformal dielectric layer to form air gaps between the plurality of metal interconnect lines.

2. The method of claim 1, wherein the carbon-based film comprises a carbon-based material selected from the group consisting of: amorphous carbon, advanced patterning films, porous carbon, and any combination thereof.

3. The method of claim 1, wherein the removal of all or part of the carbon-based film comprises a reactive process having oxygen based chemistries.

4. The method of claim 3, further comprises depositing and patterning a photoresist layer used in the forming of the said interconnect structure, and wherein the reactive process for removing all or part of the carbon-based film is also used for the simultaneous removal of the patterned photoresist layer.

5. The method of claim 3, wherein the reactive process comprises a plasma generated from a source gas comprising a gas selected from the group consisting of: ozone, oxygen, ammonia, hydrogen, and any combination thereof.

6. The method of claim 1, wherein the removal of all or part of the carbon-based film comprises a highly reactive hydrogen radicals process.

7. The method of claim 6, further comprises depositing a conformal metal barrier liner on the plurality of interconnect lines prior to the deposition of the non-conformal dielectric layer, and wherein the highly reactive hydrogen radicals process is used to remove all or part of the carbon-based film and to pre-clean the surface of the metal interconnect lines prior to the deposition of the conformal metal barrier liner, wherein the removal and pre-clean processes are combined into a single process on a single piece of equipment.

8. The method of claim 1, wherein the metal interconnect lines comprise a metal and/or conductive compound selected from the group consisting of: copper, aluminum, tantalum, tungsten, titanium, tantalum nitride, titanium nitride, tungsten nitride, and any combination thereof.

9. The method of claim 1, wherein the metal interconnect lines comprise copper.

10. A method of forming an interconnect structure comprising:
    providing a substrate on which to form the interconnect structure;
    blanket depositing a carbon-based film over the substrate;
    blanket depositing a non-carbon-based film over the carbon-based film;
    blanket depositing a layer of photoresist over the non-carbon-based film;
    patterning the photoresist layer;
    transferring the patterned photoresist layer onto the non-carbon-based film;
    transferring the patterned non-carbon-based film to the carbon-based film;
    removing the patterned photoresist layer;
    blanket depositing a metal conductor layer;
    planarizing the metal conductor layer;
    removing the patterned carbon-based film; and
    blanket depositing a non-conformal dielectric layer, wherein the non-conformal dielectric layer forms air gaps in regions between the planarized metal conductors.

11. The method of claim 10, wherein the removing of the patterned photoresist layer and the patterning of the carbon-based film are performed substantially simultaneously.

12. The method of claim 10, wherein the method of removing the patterned photoresist layer and the method of removing part of the carbon-based material to form the patterned carbon-based film, comprise substantially the same method of removing.

13. The method of claim 10, further comprising blanket depositing a conformal metal barrier liner on the planarized metal conductors, after removing the patterned carbon-based film and before depositing the non-conformal dielectric layer.

14. The method of claim 13, wherein the removal of the patterned carbon-based film comprises a highly reactive hydrogen radicals process, wherein the highly reactive hydrogen radicals process is also used to pre-clean the surface of the planarized metal conductors prior to the deposition of the conformal metal barrier liner, and wherein the removal and pre-clean processes are combined into a single process on a single piece of equipment.

15. The method of claim 13, wherein the metal barrier liner comprises a material selected from the group consisting of silicon carbide, amorphous silicon carbide, silicon nitride, silicon oxide, and any combination thereof.

16. The method of claim 13, wherein the metal barrier liner comprises a BLOk™ layer, wherein the BLOk™ layer comprises amorphous silicon carbide having a lower dielectric constant than silicon carbide.

17. The method of claim 10, further comprising planarizing the non-conformal dielectric layer having air gaps in the regions between the metal conductors, wherein the air gaps are completely engulfed within the planarized non-conformal dielectric layer, wherein the air gaps in the regions between the planarized metal conductors reduces the capacitive coupling between the planarized metal conductors.

18. The method of claim 10, wherein the metal conductor layer comprises a metal and/or conductive compound selected from the group consisting of: copper, aluminum, tantalum, tungsten, titanium, tantalum nitride, titanium nitride, tungsten nitride, and any combination thereof.

19. The method of claim 10, wherein the metal conductor layer comprises copper.

20. The method of claim 10, wherein the process to deposit the non-conformal dielectric layer comprises a chemical vapor deposition (CVD) process.

21. The method of claim 10, wherein the non-conformal dielectric layer comprises a tetra-ethyl ortho silicate (TEOS) oxide.

22. The method of claim 10, wherein the non-carbon-based film comprises a dielectric anti-reflective coating (DARC) layer.

23. The method of claim 10, wherein the non-carbon-based film comprises a hard mask, wherein the hard mask comprises a material selected from the group consisting of silicon nitride, poly silicon, silicon dioxide, amorphous silicon, boron nitride, and any combination thereof.

24. The method of claim 10, wherein the carbon-based film comprises an amorphous carbon film and/or an advanced patterning film (APF.TM.).

25. The method of claim 10, further comprising a metal siliciding process to form a metal suicide layer on an exposed metal surface on the top of the planarized metal conductor, wherein the metal siliciding process is performed prior to removing the patterned carbon-based film.

26. The method of claim 25, wherein the metal siliciding process comprises a $SiH_4$ soak followed by a $NH_3$ plasma treatment of the exposed metal surface.

27. The method of claim 10, further comprising a selective metal deposition to form a selective metal cap on an exposed metal surface on the top of the planarized metal conductor, wherein the selective metal deposition is performed prior to removing the patterned carbon-based film.

28. The method of claim 27, wherein the selective metal cap comprises W and/or CoWP materials.

* * * * *